(12) United States Patent
Kimura et al.

(10) Patent No.: US 8,212,325 B2
(45) Date of Patent: Jul. 3, 2012

(54) ELECTROSTATIC VIBRATOR AND ELECTRONIC APPARATUS

(75) Inventors: Fumio Kimura, Chiba (JP); Ryohei Kamiya, Chiba (JP); Hiroshi Takahashi, Chiba (JP); Ryuta Mitsusue, Chiba (JP); Yoshifumi Yoshida, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 12/737,170

(22) PCT Filed: Jun. 23, 2009

(86) PCT No.: PCT/JP2009/061424
§ 371 (c)(1),
(2), (4) Date: Feb. 7, 2011

(87) PCT Pub. No.: WO2009/157453
PCT Pub. Date: Dec. 30, 2009

(65) Prior Publication Data
US 2011/0127621 A1    Jun. 2, 2011

(30) Foreign Application Priority Data

Jun. 25, 2008  (JP) .................. 2008-166283
Jun. 3, 2009   (JP) .................. 2009-133892

(51) Int. Cl.
*H01L 29/84* (2006.01)
(52) U.S. Cl. ........................................ 257/415
(58) Field of Classification Search .......... 257/415, 257/E29.324, E27.324, E21.613; 438/50, 438/52; 331/158; 310/344, 348, 311
See application file for complete search history.

(56) References Cited

U.S. PATENT DOCUMENTS

| | | | |
|---|---|---|---|
| 3,242,061 A * | 3/1966 | Armstrong | 438/121 |
| 4,011,577 A * | 3/1977 | Tanimura et al. | 257/418 |
| 4,019,197 A * | 4/1977 | Lohstroh et al. | 257/318 |
| 5,449,909 A * | 9/1995 | Kaiser et al. | 250/336.1 |

FOREIGN PATENT DOCUMENTS

| | | | |
|---|---|---|---|
| JP | 2008066801 | * | 6/2007 |
| JP | 2008-66801 | * | 3/2008 |
| WO | WO 2007072409 | * | 6/2007 |
| WO | WO2007072409 | * | 3/2008 |

OTHER PUBLICATIONS

T. Mattila, et al., "14 MHz Micromechanical Oscillator", Transducers'01 Eurosensors XV, The 11th International Conference on Solid-State Sensors and Actuators, Munich, Germany, Jun. 10-14, 2001.

* cited by examiner

*Primary Examiner* — Dao H Nguyen
*Assistant Examiner* — Tram H Nguyen
(74) *Attorney, Agent, or Firm* — Adams & Wilks

(57) ABSTRACT

An electrostatic vibrator has a vibrating plate including beam-shaped vibrating parts each fixed at opposite ends thereof and configured for electrostatic actuation to perform flexural vibration, and temperature compensation parts connected to the vibrating parts. A silicon oxide film covers each of the vibrating parts but not the temperature compensation parts. A substrate is mounted in parallel relation to the vibrating plate. An oxide layer is disposed between the substrate to the vibrating plate. Electrodes are formed on the substrate and arranged on opposite sides of each of the vibrating parts.

20 Claims, 21 Drawing Sheets

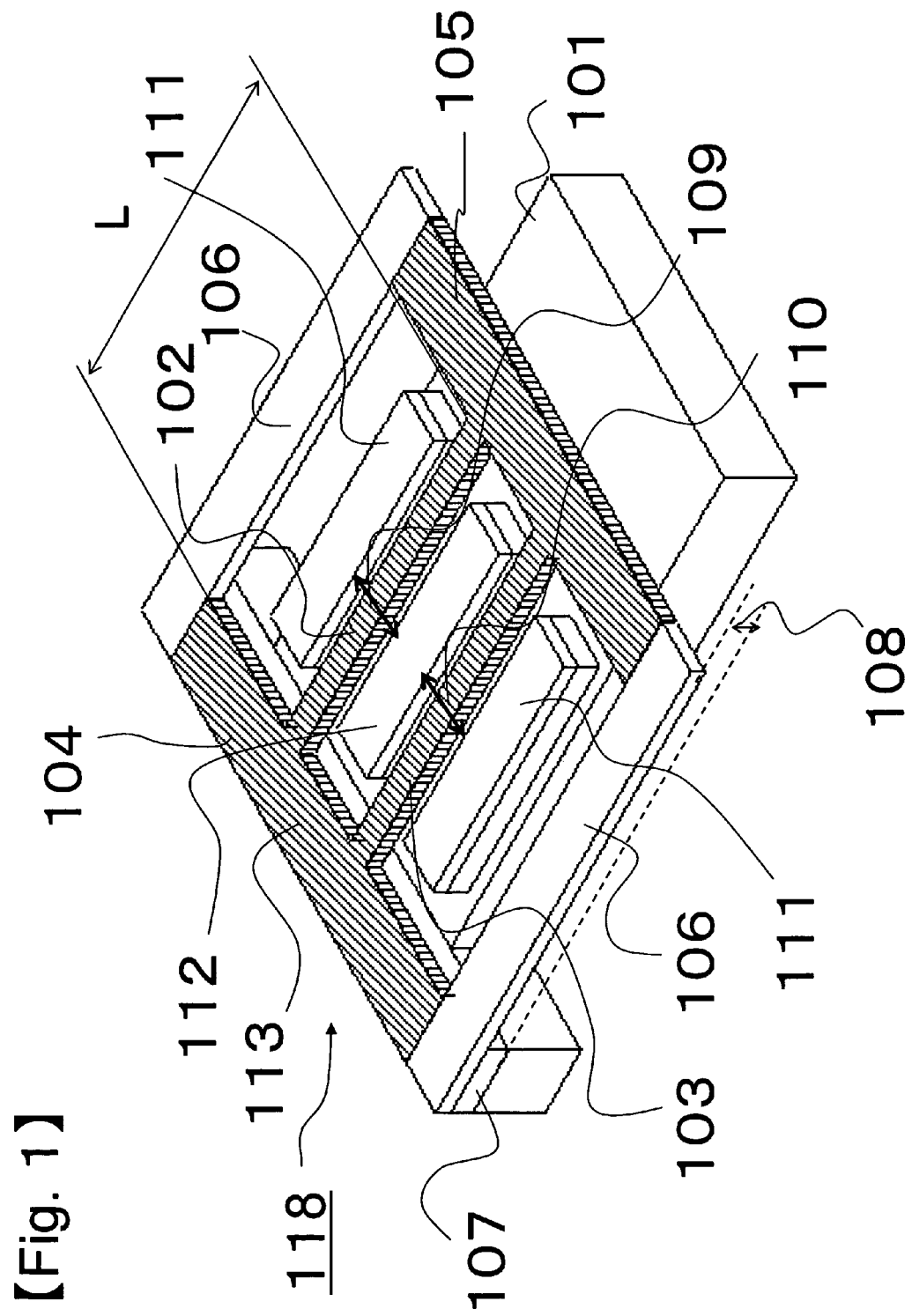
[Fig. 1]

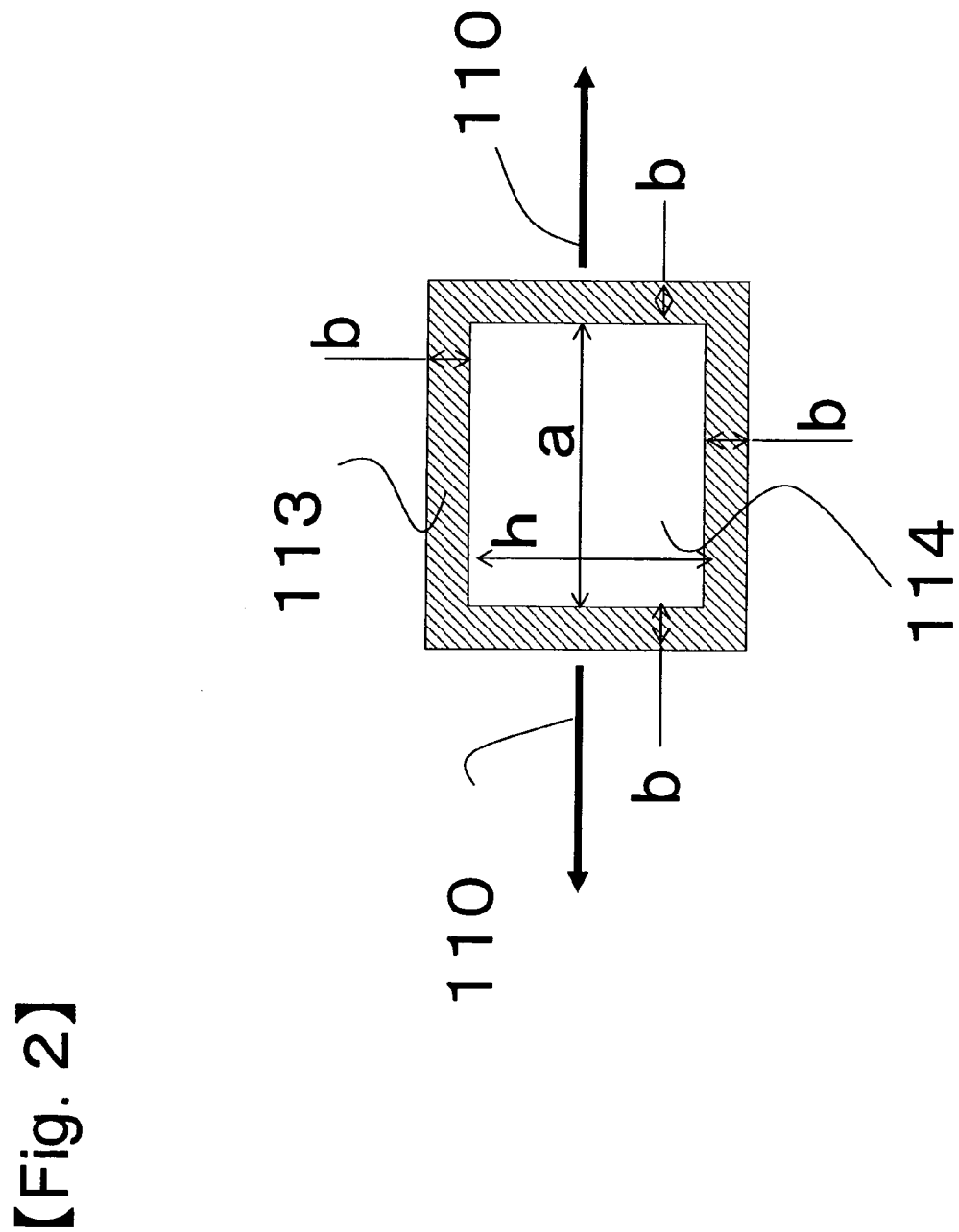
[Fig. 2]

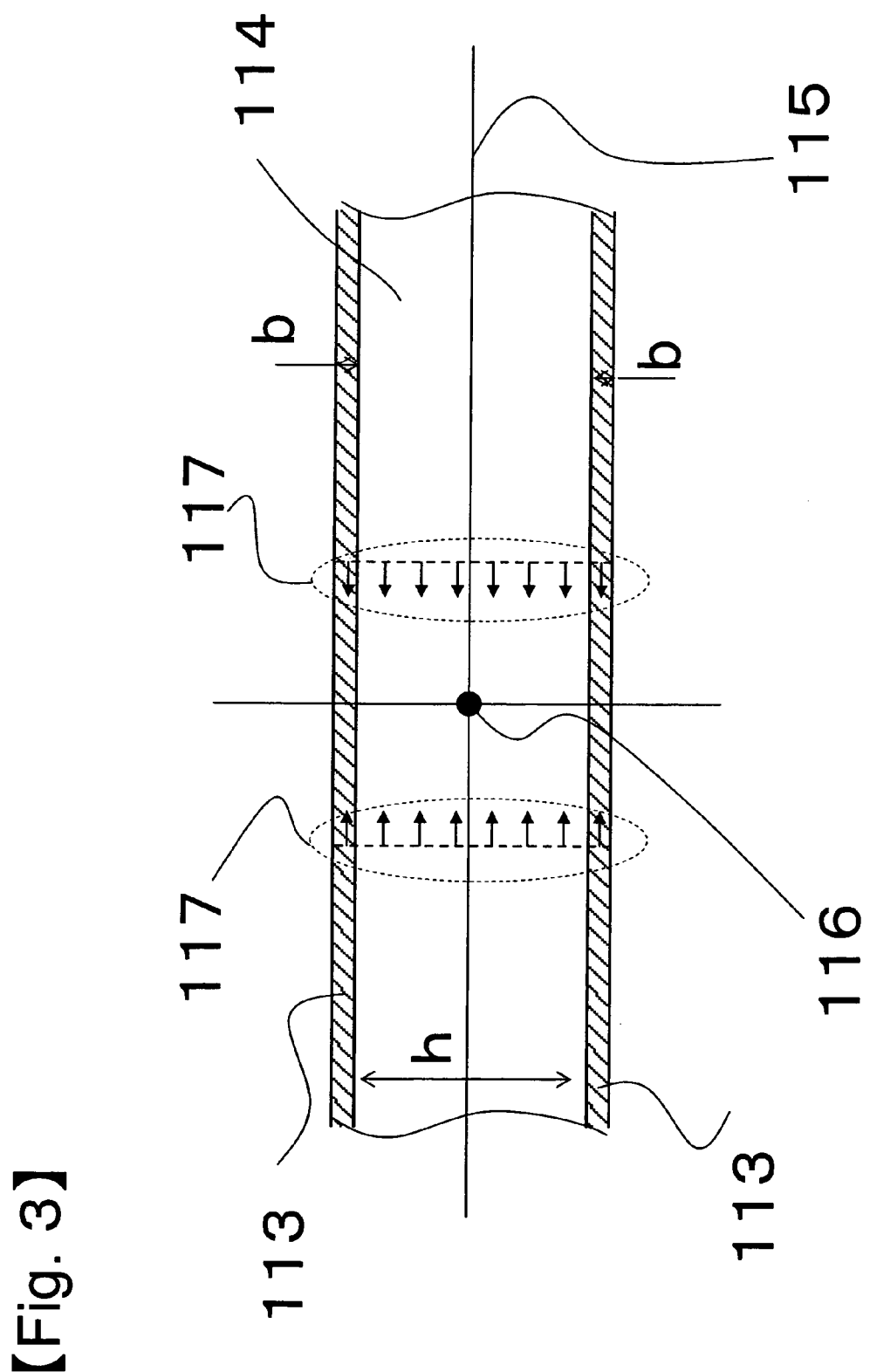
[Fig. 3]

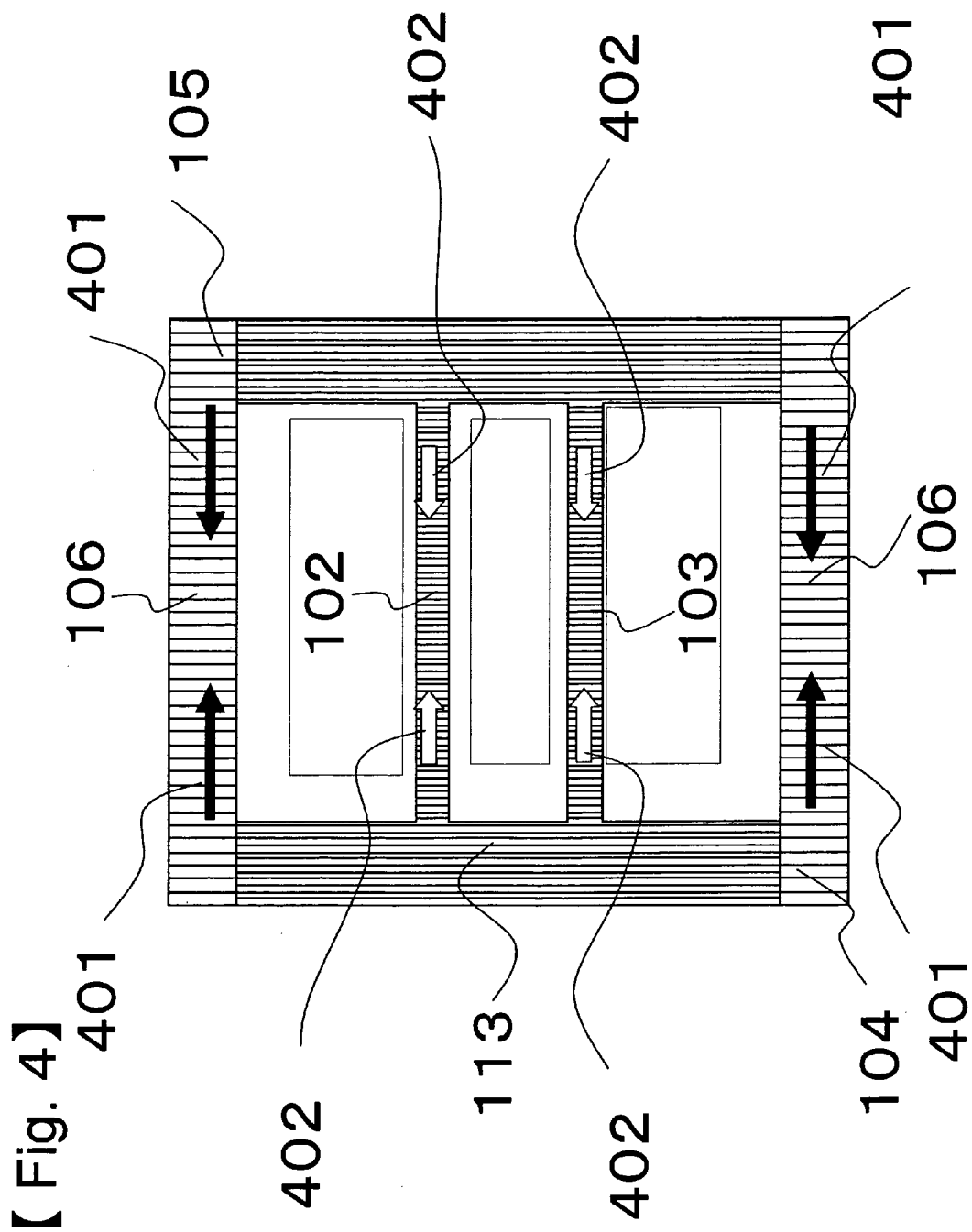
[Fig. 4]

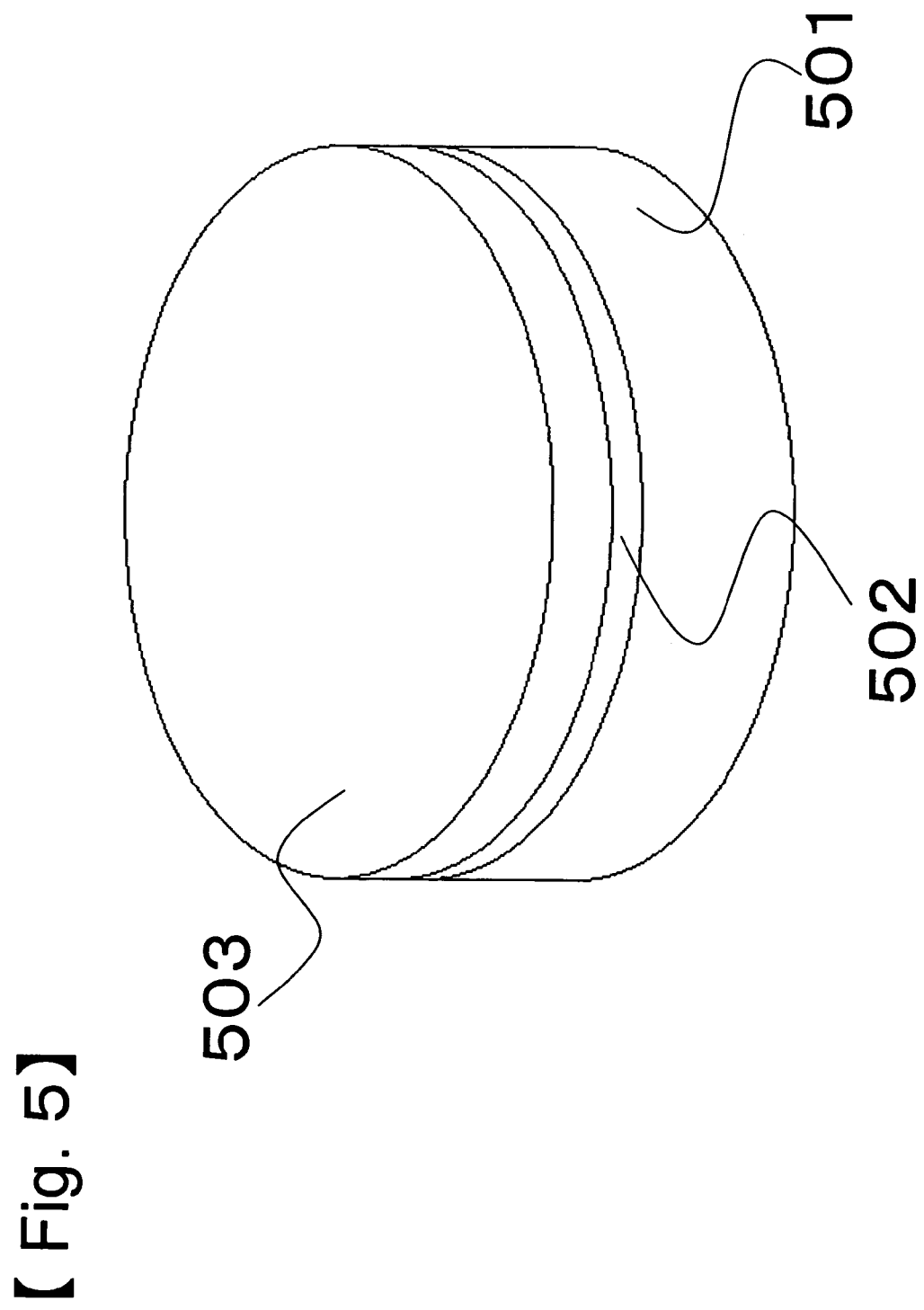
[Fig. 5]

[Fig. 6]
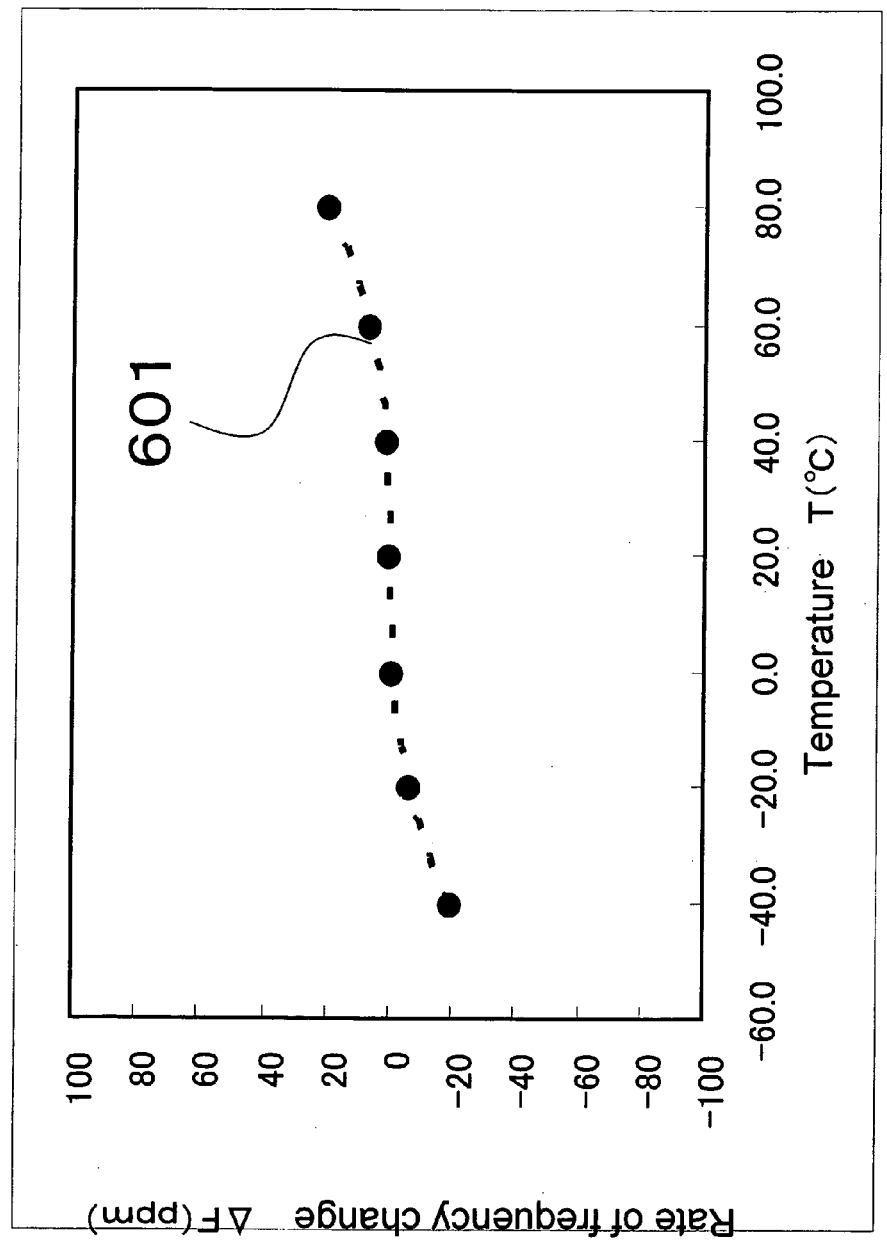

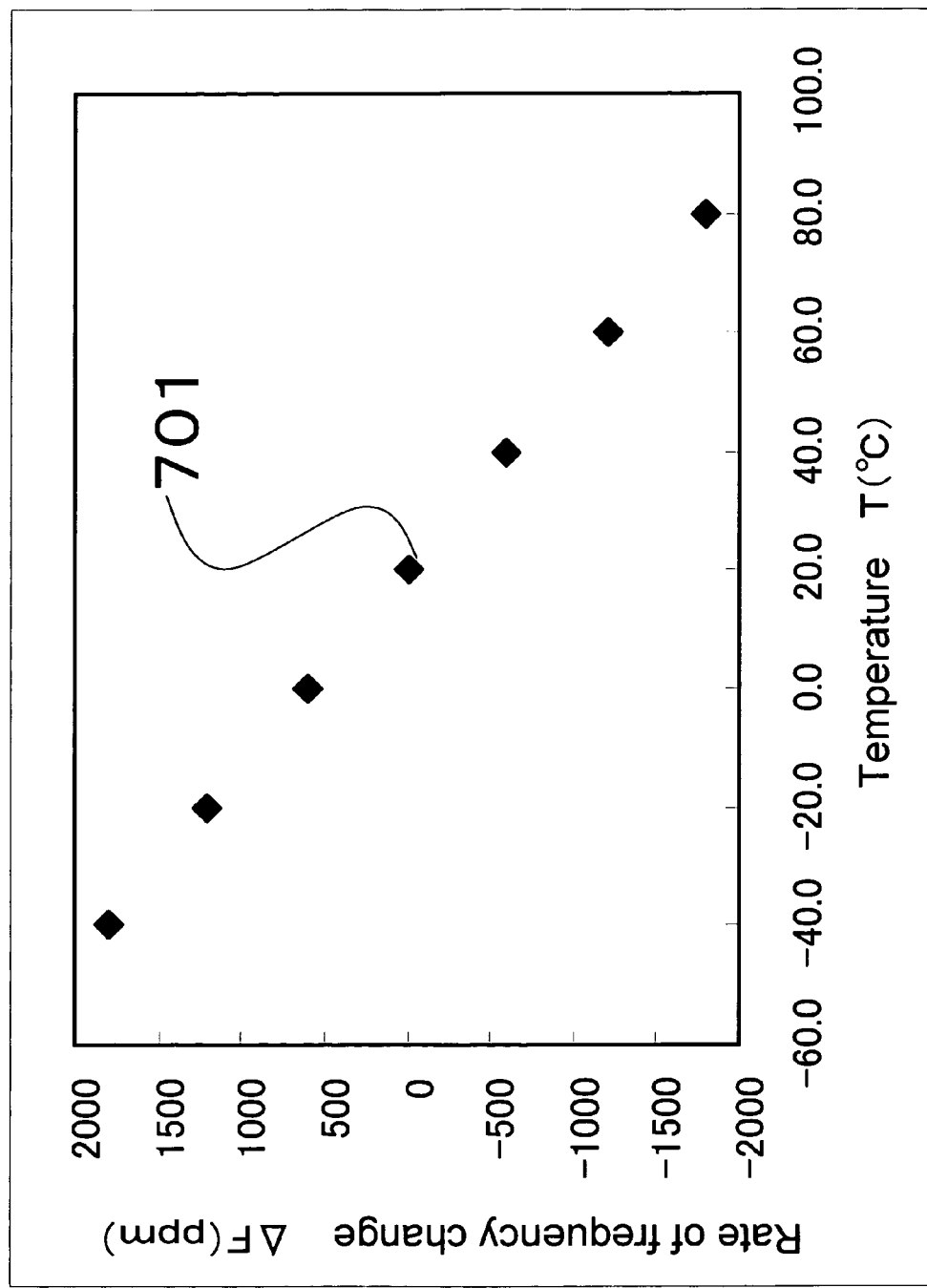
[Fig. 7]

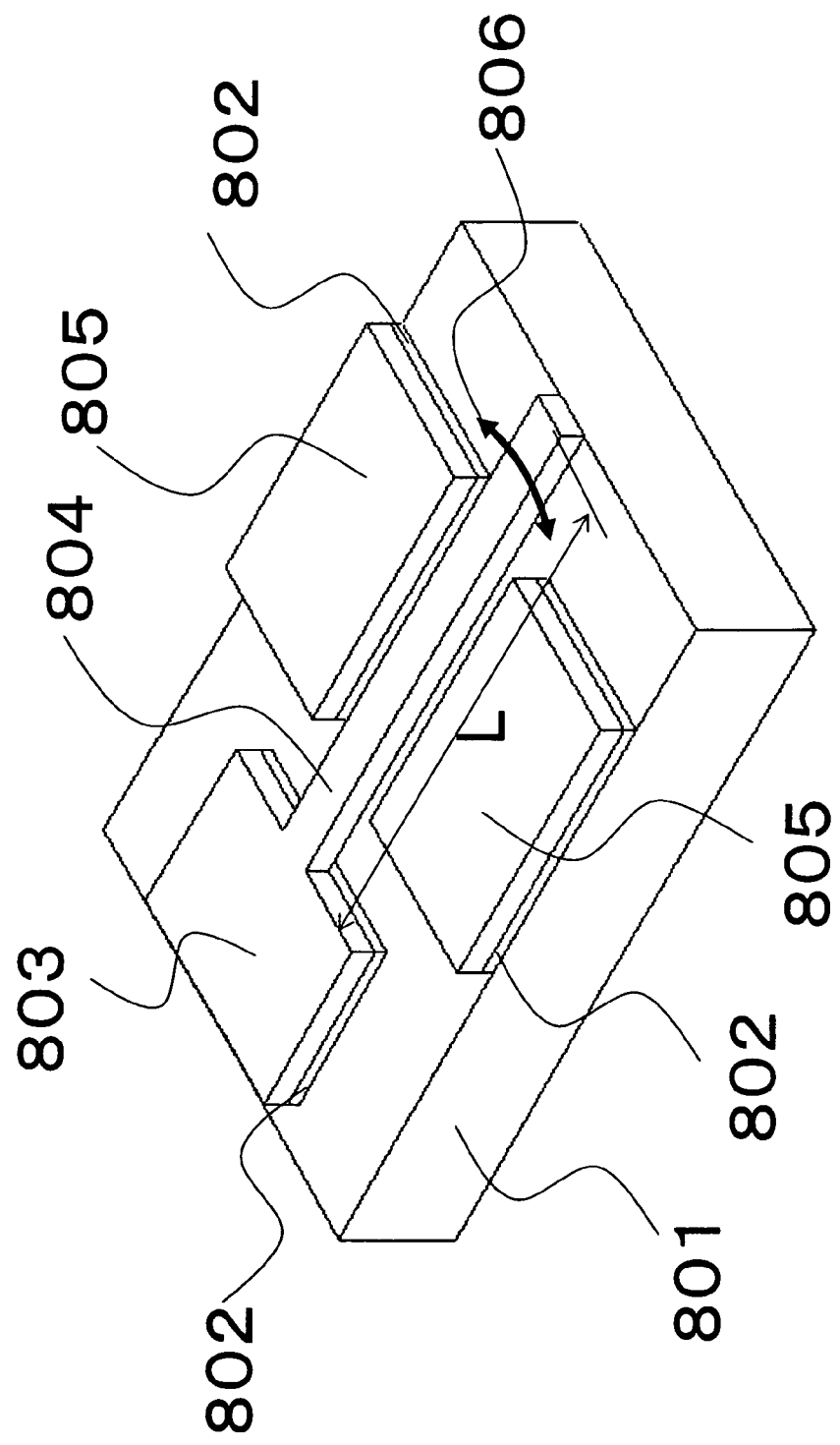

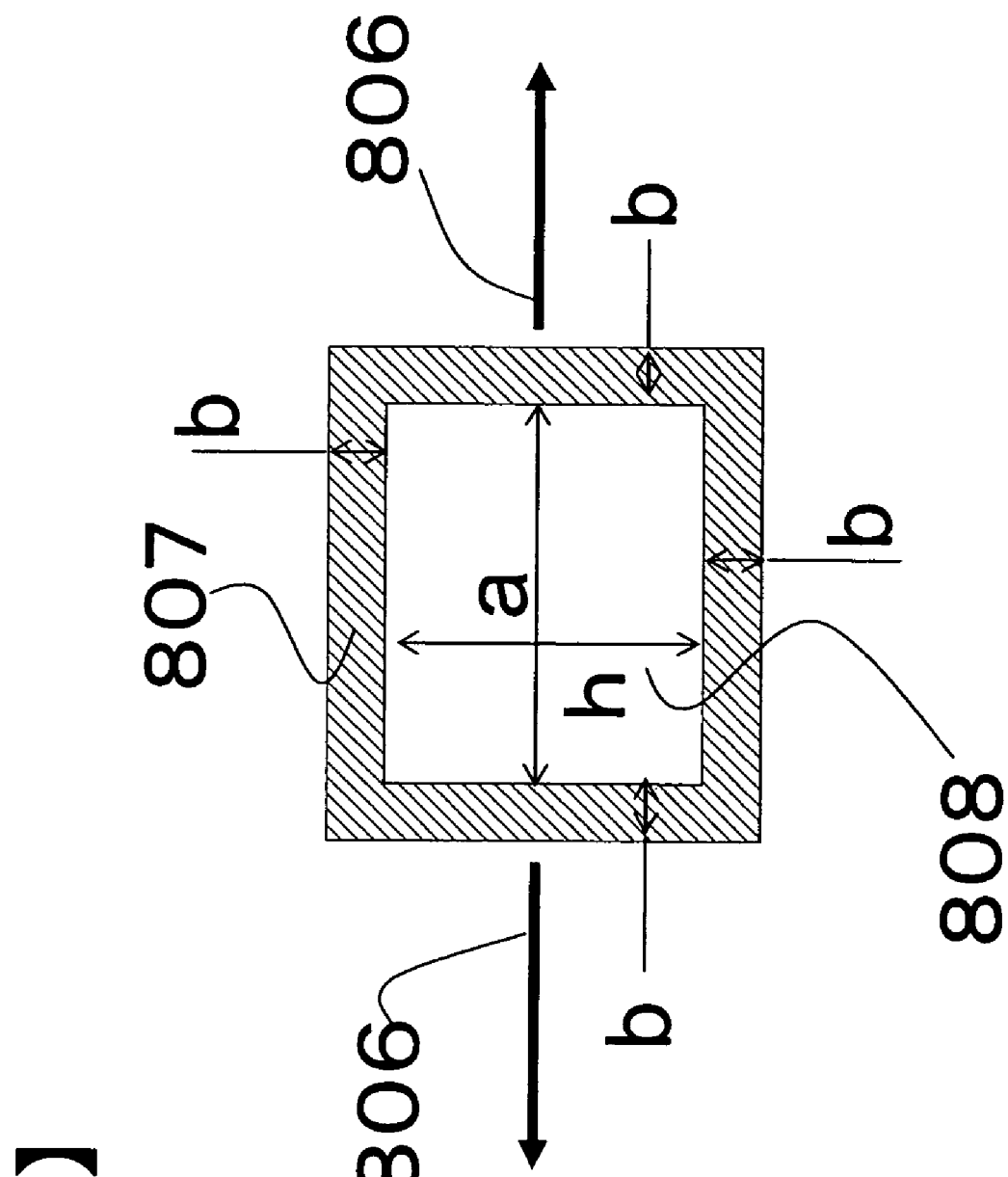
[Fig. 9]

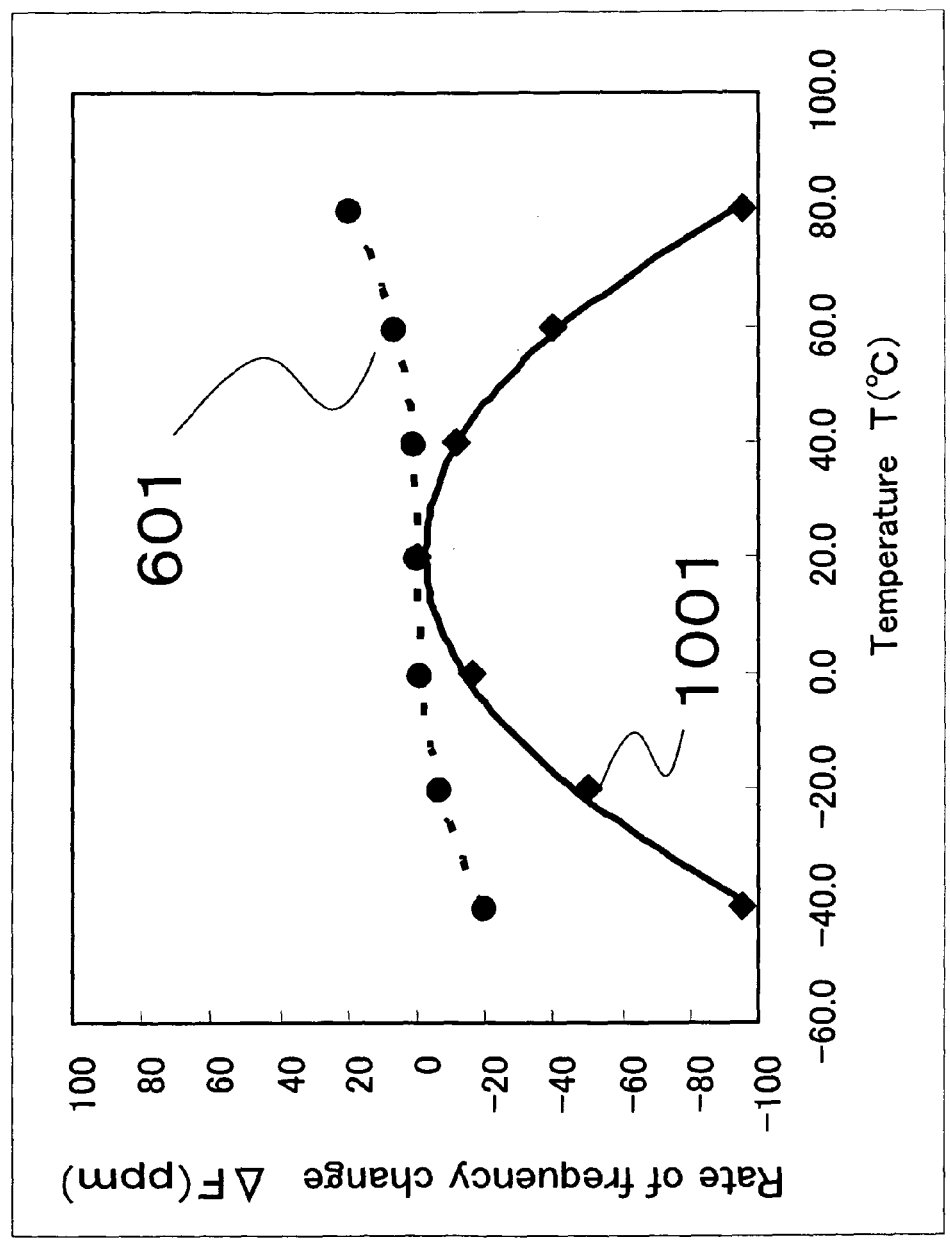
[Fig. 10]

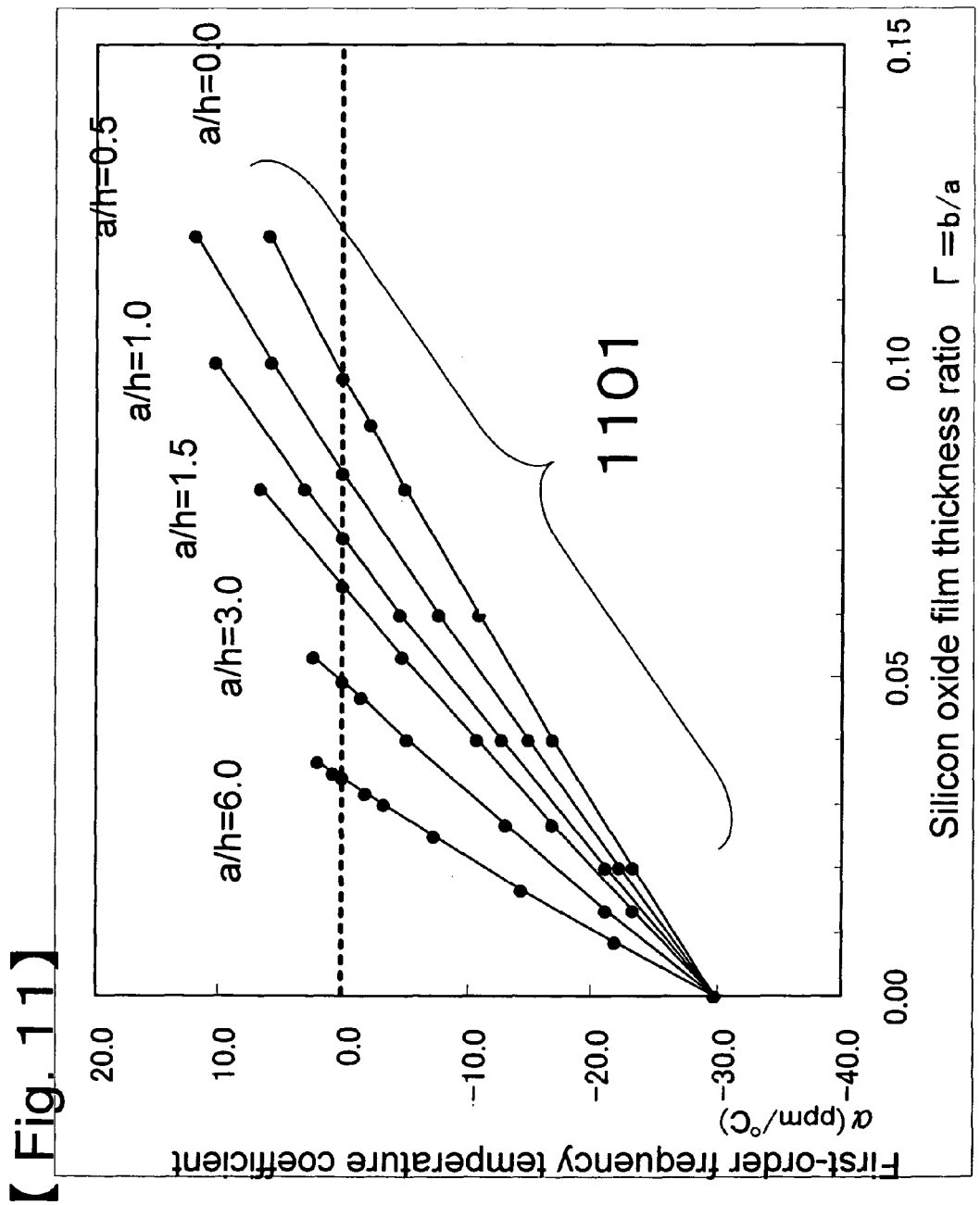
[Fig. 11]

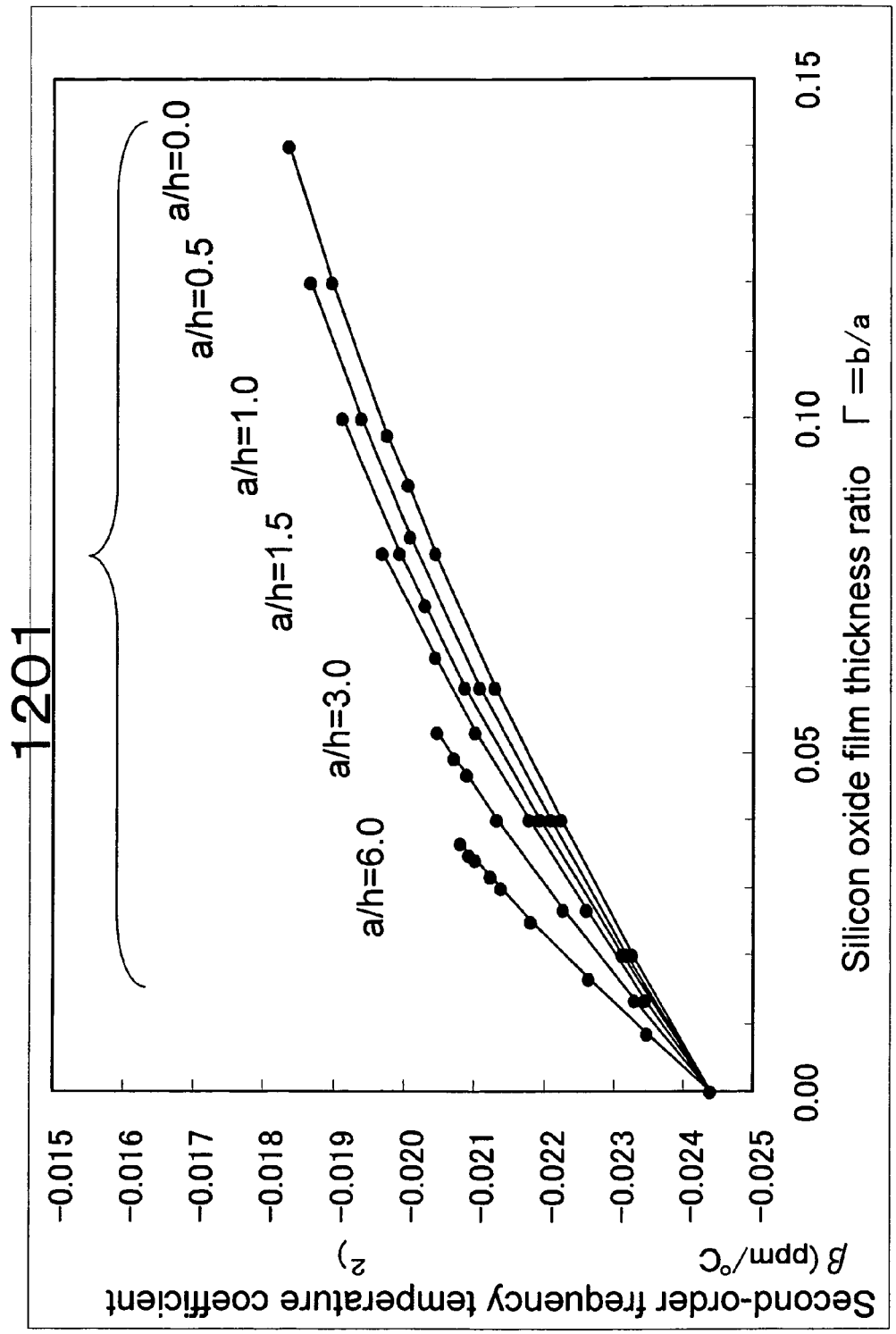
[Fig. 12]

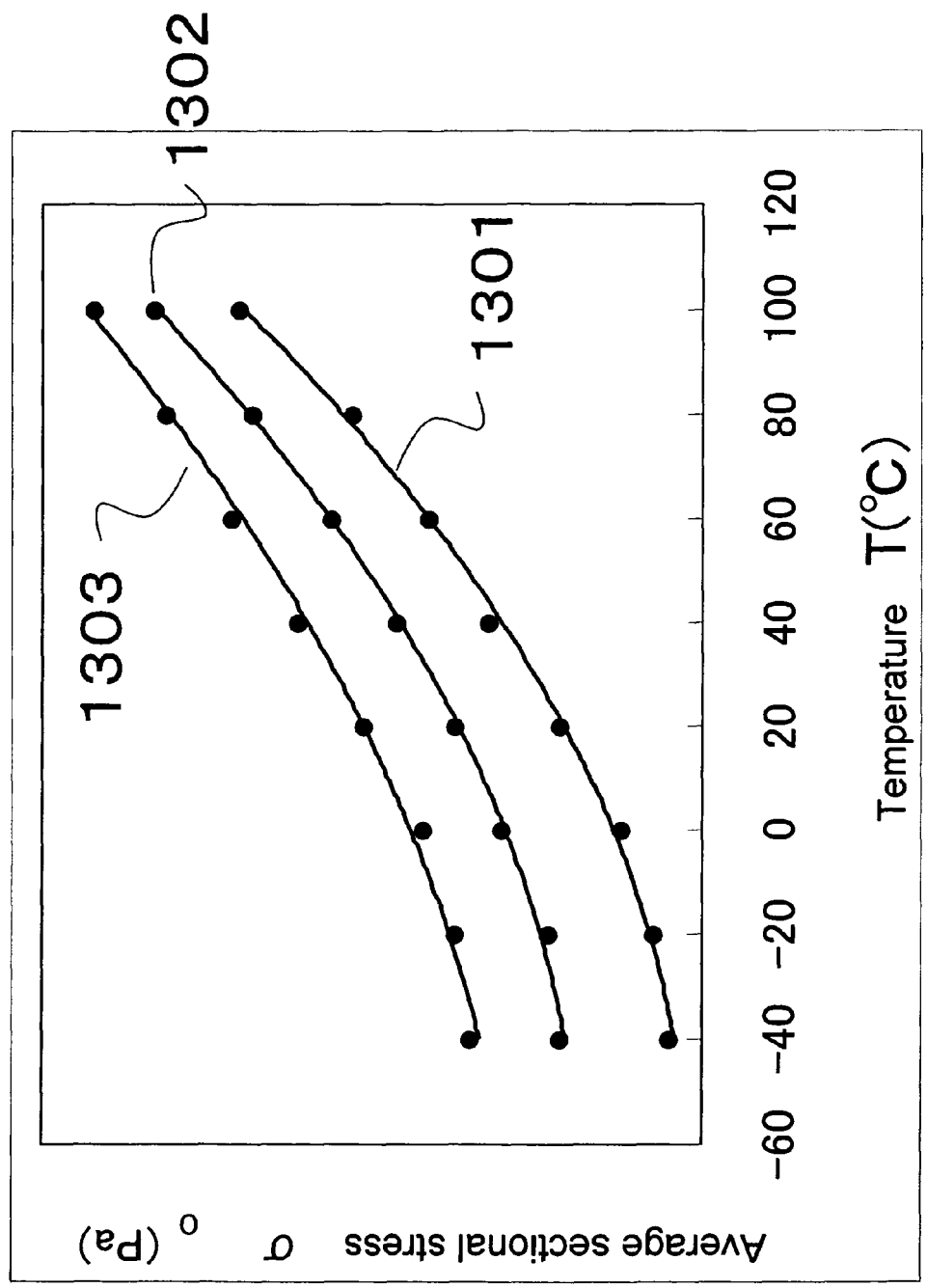
[Fig. 13]

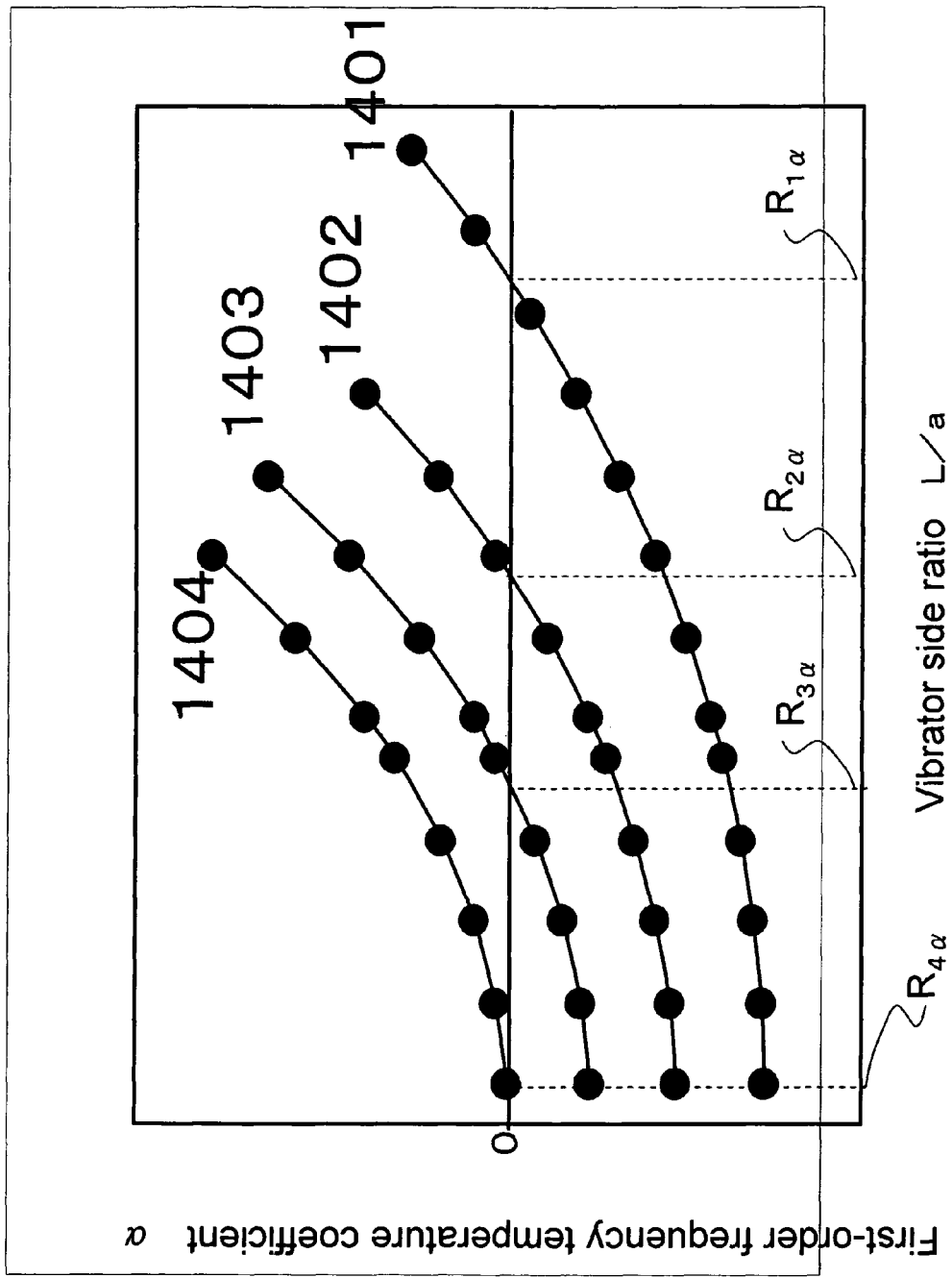
[Fig. 14]

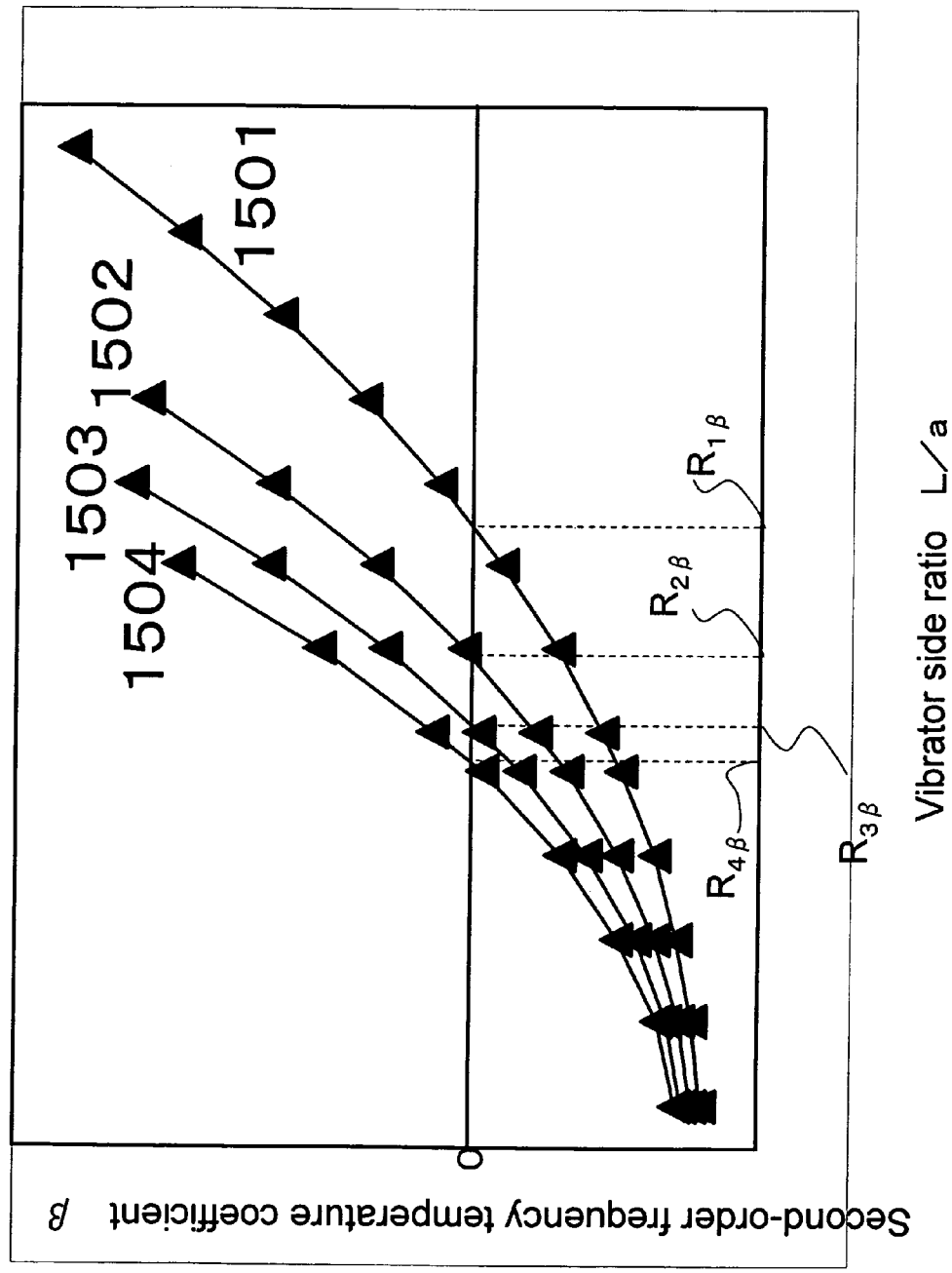
[Fig. 15]

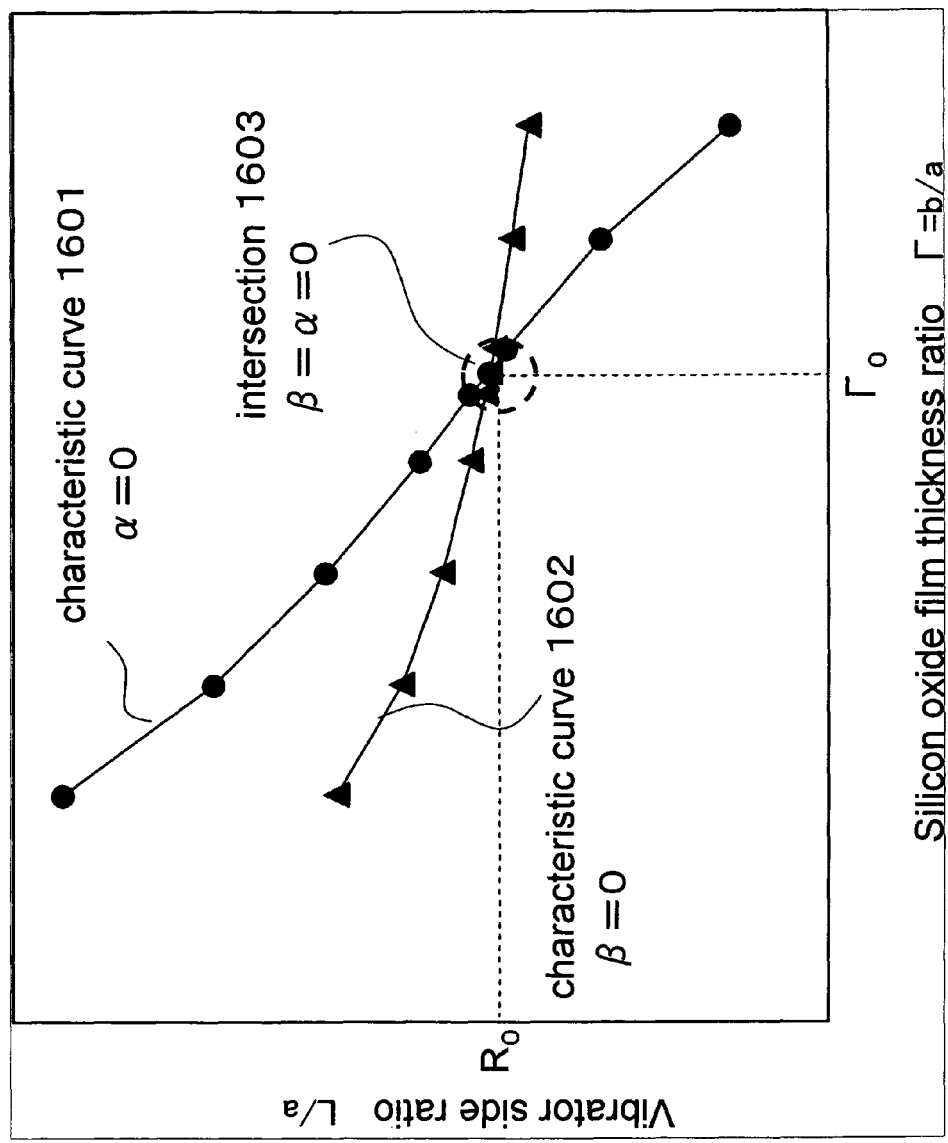
[Fig. 16]

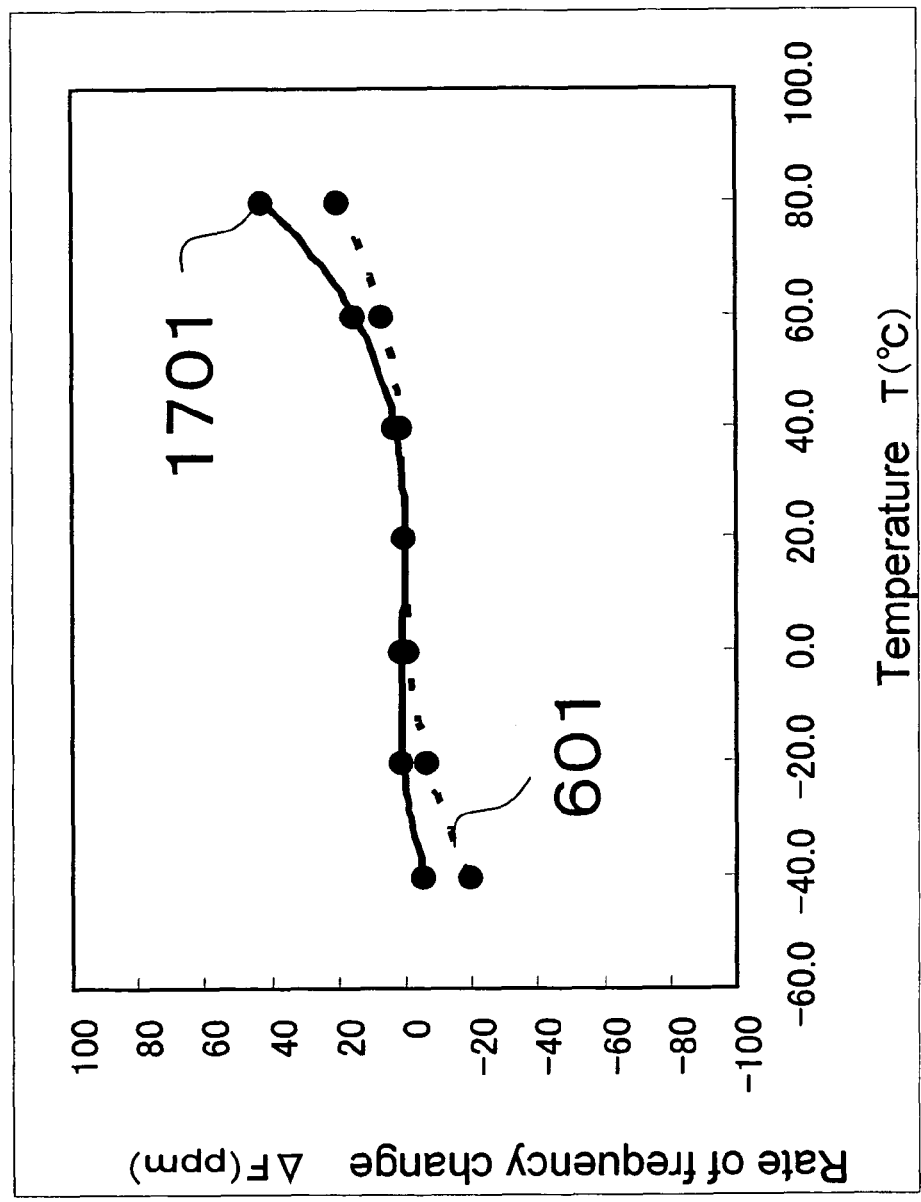
[Fig. 17]

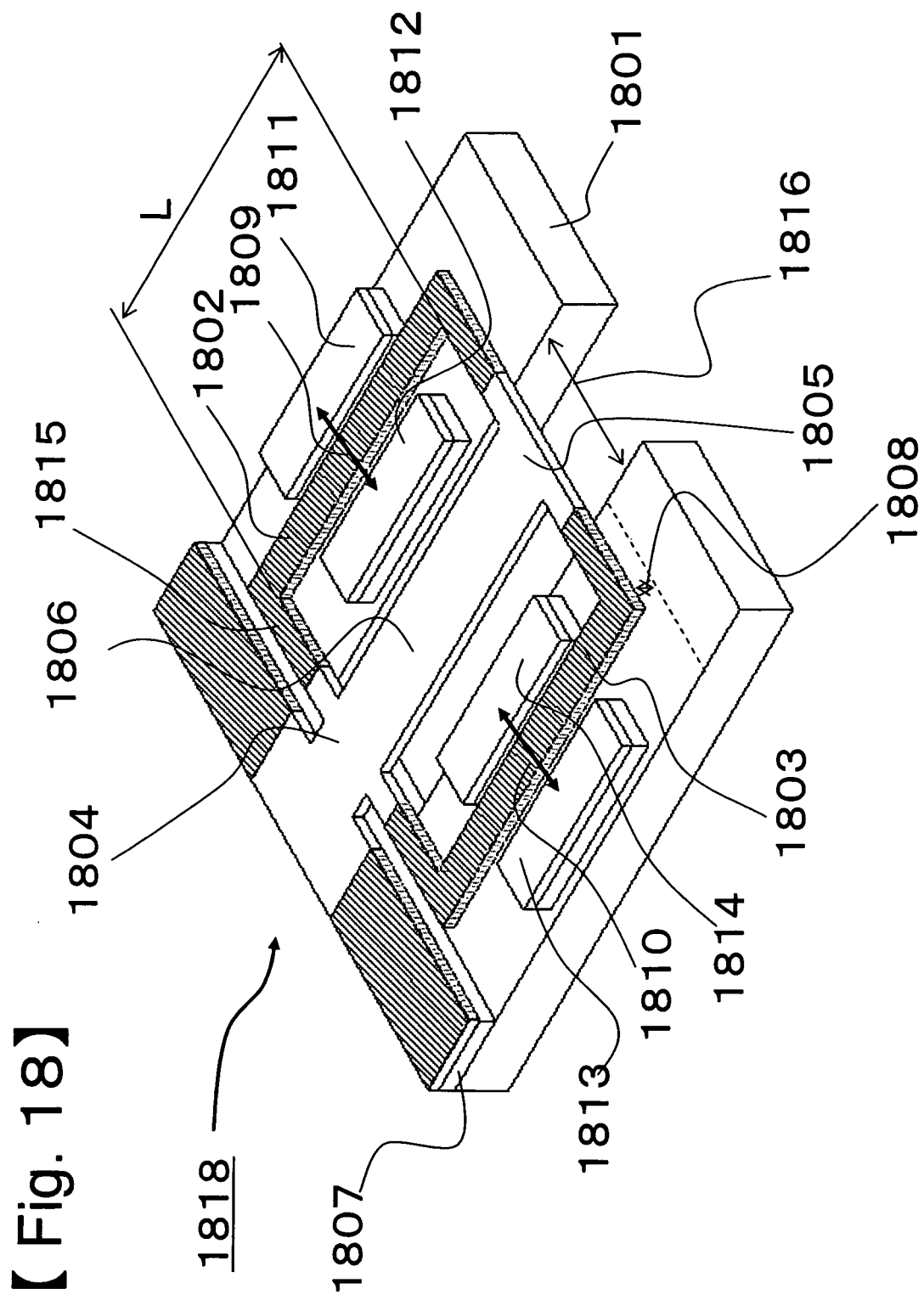
[Fig. 18]

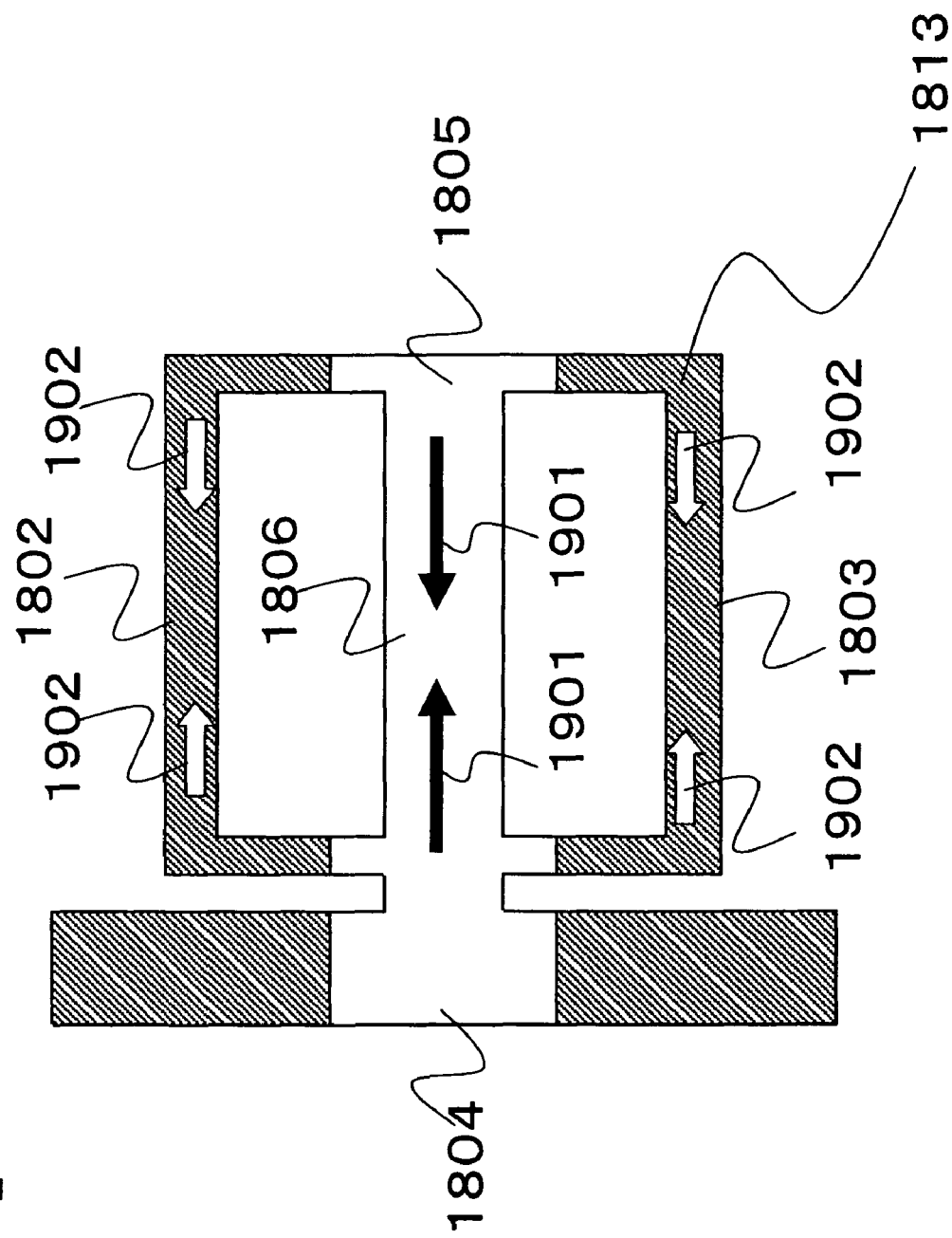
[Fig. 19]

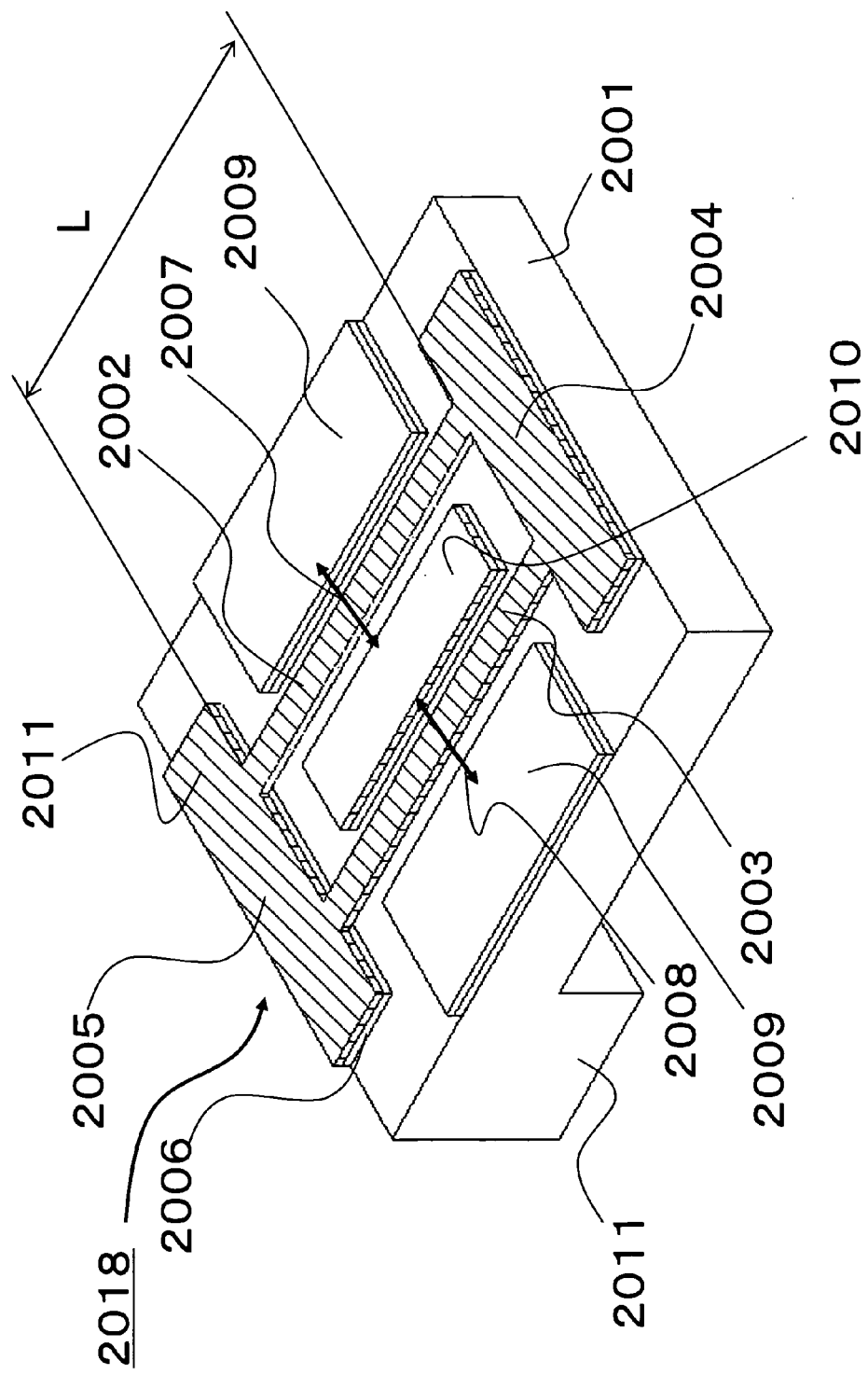
[Fig. 20]

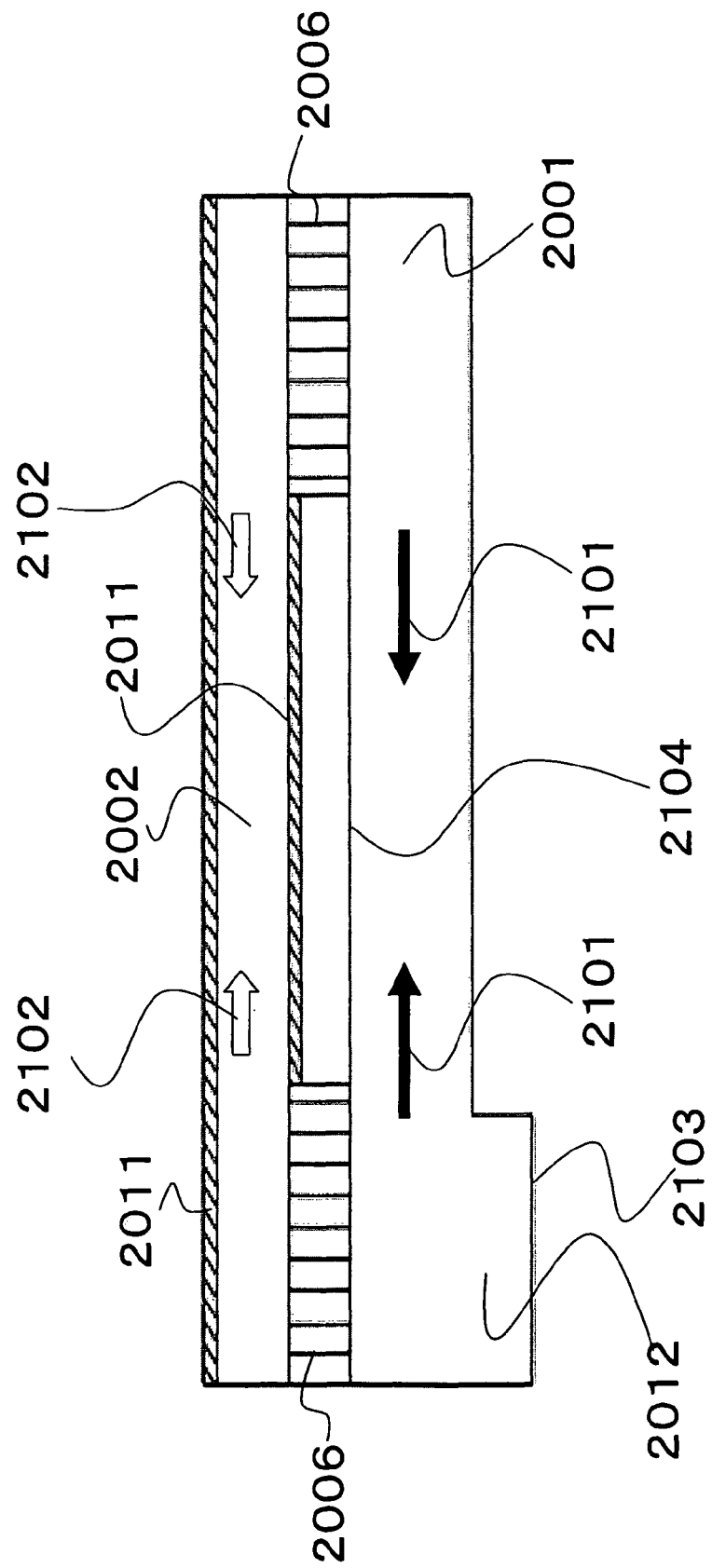

ELECTROSTATIC VIBRATOR AND ELECTRONIC APPARATUS

CROSS-REFERENCE TO RELATED APPLICATIONS

This application is a U.S. national stage application of International Application No. PCT/JP2009/061424 filed Jun. 23, 2009, claiming an earliest priority date of Jun. 25, 2008, and published in a non-English language.

BACKGROUND OF THE INVENTION

1. Technical Field

The present invention relates to an electrostatic vibrator which is used as a reference frequency oscillator of various types of electronic apparatuses, and to an electronic apparatus having the electrostatic vibrator.

2. Background Art

In electronic apparatuses such as wireless portable apparatuses as represented by cellular phones, personal computers, or timepieces, there is an increasing demand to achieve size-reduction and higher accuracy. In such electronic apparatuses, a high-frequency signal source which is compact and stable is indispensable. An AT-cut quartz vibrator (hereinafter, simply abbreviated as an AT-cut) is a typical electronic component that meets this demand.

It is known that due to its good crystal stability, the sharpness of the resonance of the AT-cut, which is a quality index of an oscillation element, namely the Q value, is very large and exceeds 10000. This is why the AT-cut is widely used as a stable high-frequency signal source for wireless portable apparatuses and personal computers. However, it is also known that the AT-cut cannot sufficiently meet the strong demand in recent years for achieving size-reduction.

That is, with a dramatic improvement in silicon MEMS (Micro-Electro-Mechanical-System) techniques, almost every high-frequency electronic components other than the AT-cut are realized as one-chip components by being integrated with and bonded to an IC. However, since physical bonding of quartz monocrystals and silicon crystals is very difficult, the integration and bonding thereof is not possible. Therefore, the realization of the high-frequency electronic components including the AT-cut as one-chip components was not possible. This is the reason why the AT-cut cannot sufficiently meet the demand in recent years for achieving size-reduction.

In order to solve this problem, a vibrator that has been gathering attention in recent years is an electrostatic vibrator which uses silicon monocrystals and MEMS techniques. The electrostatic vibrator is a vibrator that converts a mechanical vibration having high Q characteristics of a vibrator formed of silicon to electrical signals by electrostatic force. Moreover, the electrostatic vibrator can realize impedance characteristics having high Q characteristics equivalent to a quartz vibrator. Furthermore, the electrostatic vibrator can realize integration and bonding with an IC which cannot be realized in the quartz vibrator as represented by the AT-cut. By this construction and corresponding functions, the electrostatic vibrator is a vibrator having extraordinary characteristics (see Non-Patent Literature 1, for example).

The electrostatic vibrator is manufactured by using an SOI wafer shown in FIG. 5. FIG. 5 is a schematic diagram of the SOI wafer. The SOI wafer is a three-layered wafer including a silicon substrate 501, a silicon oxide layer, namely a box layer 502, formed on the silicon substrate 501, and a silicon layer 503 formed on the box layer 502. An electrostatic vibrator according to the present invention is formed in the silicon layer 503 part shown in FIG. 5 using MEMS techniques such as DRIE.

CITATION LIST

Non-Patent Literature

[NPL 1] T. Mattila et al., "14 MHz Micromechanical Oscillator," TRANSDUCERS '01 EUROSENSORS XV, The 11th International Conference on Solid-State Sensors and Actuators, Munich, Germany, 2001

However, the conventional electrostatic vibrator has problems as described below. FIG. 6 is a characteristic diagram showing frequency temperature characteristics of the AT-cut. In FIG. 6, the vertical axis represents the rate of frequency change and the horizontal axis represents temperature. A characteristic curve 601 in the figure represents the frequency temperature characteristics of the AT-cut. Moreover, FIG. 7 is a characteristic diagram showing frequency temperature characteristics of the conventional electrostatic vibrator. Similarly to FIG. 6, the vertical axis represents the rate of frequency change, and the horizontal axis represents temperature. Furthermore, a characteristic curve 701 represents the frequency temperature characteristics of the electrostatic vibrator.

In general, if temperature is represented by T, reference temperature is represented by $T_0$, and the rate of frequency change is represented by $\Delta F$, the characteristic curve of the frequency temperature characteristics of a vibrator can be approximately represented by Equation 1.

[Equation 1]

$$\Delta F = \alpha(T-T_0) + \beta(T-T_0)^2 + \gamma(T-T_0)^3 \qquad (1)$$

Here, $\alpha$ is a first-order temperature coefficient of frequency, $\beta$ is a second-order temperature coefficient of frequency, and $\gamma$ is a third-order temperature coefficient of frequency.

TABLE 1

| Temperature Coefficient of Frequency | Electrostatic Vibrator | AT-cut |
|---|---|---|
| $\alpha$ (ppm/° C.) | −29.0 | +0.1 |
| $\beta$ (ppm/° C.^2) | −3.0 × 10$^{-2}$ | −3.0 × 10$^{-3}$ |
| $\gamma$ (ppm/° C.^3) | 1.0 × 10$^{-4}$ | 1.0 × 10$^{-4}$ |

Table 1 shows the coefficients $\alpha$, $\beta$, and $\gamma$ of the characteristic curve 601 shown in FIG. 6 showing the frequency temperature characteristics of the AT-cut and the characteristic curve 701 shown in FIG. 7 showing the frequency temperature characteristics of the electrostatic vibrator. Here, the numeric values shown in Table 1 are numeric values at a reference temperature $T_0 = 20°$ C.

From comparison between the characteristic curves shown in FIGS. 6 and 7 and comparison between the temperature coefficient values shown in Table 1, it can be found that the rate of frequency change of the electrostatic vibrator with respect to temperature is extremely larger than that of the AT-cut. Particularly, from Table 1, it can be found that the values of the first and second-order temperature coefficients of frequency $\alpha$ and $\beta$ of the electrostatic vibrator which are extremely large as compared with the numeric values of the AT-cut are the causes of deterioration of the rate of frequency change of the electrostatic vibrator. Thus, as described above, despite the fact that the electrostatic vibrator has extraordinary characteristics, it is still difficult to use the electrostatic vibrator in practical applications due to the large frequency change rate thereof.

In order to solve this problem, a method of forming a silicon oxide film in a vibrating part of the electrostatic vibrator is proposed. However, since the frequency temperature characteristics are still not sufficient, practical realization thereof is not progressing. The reasons thereof will be described below. FIGS. 8 and 9 are schematic diagrams of an electrostatic vibrator using such a method. FIG. 8 is a perspective view of a flexural vibration-mode electrostatic vibrator in which one end of a vibrating part is fixed. A fixed part 803 and a vibrating part 804 are integrally formed with a box layer 802 on a silicon substrate 801 disposed therebetween. Two pairs of excitation electrodes 805 are disposed so as to induce a flexural vibration displacement 806 of the vibrating part 804. The excitation electrodes 805 are formed on the box layer 802. Here, the length dimension of the vibrating part 804 is L.

FIG. 9 is a sectional view of the vibrating part 804 shown in FIG. 8. The sectional structure of the vibrating part 804 has a two-layered structure including a silicon oxide film 807 surrounding the cross section and a silicon part 808 at the central part. In FIG. 9, the width dimension of the vibrating part 804 is defined as the dimension of the silicon part 808 parallel to the flexural vibration displacement 806 as shown in the figure, and the value is a. Moreover, the thickness of the vibrating part 804 is defined as the dimension of the silicon part 808 vertical to the vibration displacement 806, and the value is h. Furthermore, the thickness of the silicon oxide film 807 formed around the silicon part 808 is b.

FIG. 10 is a characteristic diagram showing frequency temperature characteristics of the electrostatic vibrator described in FIGS. 8 and 9. In FIG. 10, the vertical axis represents rate of frequency change, and the horizontal axis represents temperature. In the figure, a characteristic curve 1001 represents the frequency temperature characteristics of the electrostatic vibrator attached silicon oxide film. Moreover, a characteristic curve 601 represents the frequency temperature characteristics of the AT-cut. The characteristic curve 1001 has a very small rate of change as compared with the characteristic curve 701 shown in FIG. 7. However, the curve has a parabolic shape and the frequency temperature characteristics are still not sufficient as compared with the characteristic curve 601 which represents the frequency temperature characteristics of the AT-cut.

Here, the first and second-order temperature coefficients of frequency α and β of the characteristic curve 601 are 0.1 ppm/° C. and $-2.5 \times 10^{-3}$ ppm/° C.$^2$, respectively. That is, in the electrostatic vibrator attached silicon oxide film, a first-order temperature coefficient of frequency a which has almost the same value as the first-order temperature coefficient of frequency of the AT-cut is realized. However, regarding the second-order temperature coefficient of frequency β, a value which is almost the same as the second-order temperature coefficient of frequency of the AT-cut is not realized.

The reasons thereof will be described below. The resonance frequency F of the electrostatic vibrator attached silicon oxide film shown in FIGS. 8 and 9 is given by Equation (2).

[Equation 2]

$$F = \frac{(1.875)^2}{4\pi} \sqrt{\frac{E_S}{3\rho_S}} \frac{a}{L^2}(1 + 2\Gamma)\phi(\Gamma) \quad (2)$$

Here, $E_s$ and $\rho_s$ are the Young's modulus and density of silicon, respectively. Moreover, a and L are the width and length dimensions of the vibrator shown in FIGS. 8 and 9. In addition, a silicon oxide film thickness ratio Γ and an oxide film correction function φ(Γ) can be written as Equations (3) and (4) by using the width of the vibrator and the thickness of the silicon oxide film which are a and b, respectively.

[Equation 3]

$$\Gamma = b/a \quad (3)$$

[Equation 4]

$$\phi(\Gamma) = \sqrt{\frac{1 + \frac{2\Gamma}{1+2\Gamma}\left\{1 + \frac{1}{1+2\Gamma} + \frac{1}{(1+2\Gamma)^2}\right\}\Delta_E + 2\frac{b}{h}(1+\Delta_E)}{1 + \frac{2\Gamma}{1+2\Gamma}\Delta_\rho + 2\frac{b}{h}(1+\Delta_\rho)}} \quad (4)$$

φ(Γ) is a dimensionless function defined by the above equation. In addition, ΔE, and Δρ in Equation (4) can be written as Equations (5) and (6) by using the Young's modulus and density of the silicon oxide film which are $E_o$ and $\rho_o$, respectively.

[Equation 5]

$$\Delta E = (E_0 - E_s)/E_s \quad (5)$$

[Equation 6]

$$\Delta_\rho = (\rho_0 - \rho_s)/\rho_s \quad (6)$$

ΔE and Δρ are defined as Equations 5 and 6.

The temperature characteristics of the resonance frequency of the vibrator having the two-layered structure constructed from silicon and the silicon oxide film as given by Equation 2 is substantially determined by the temperature coefficient of the Young's modulus and the temperature coefficient of the density of the silicon and the silicon oxide film. The above equations are equations which are derived from a theoretical background that the silicon oxide film formed around the cross section of the vibrating part changes a second moment of area of the vibrating part. Physically, a change in the frequency temperature characteristics can be explained from a change in the temperature characteristics of the second moment of area.

TABLE 2

| | | Values | First-Order Temperature Coefficient (ppm/° C.) | Second-Order Temperature Coefficient (ppm/° C.$^2$) |
|---|---|---|---|---|
| Silicon | Young's Modulus $E_S$ (Gpa) | 130 | −63 | $-56 \times 10^{-3}$ |
| | Density $\rho_S$ (Kg/m$^3$) | 2300 | −8.5 | $-25.5 \times 10^{-3}$ |
| Silicon Oxide Film | Young's Modulus $E_0$ (Gpa) | 57 | +195 | $0 \text{ to } 10 \times 10^{-3}$ |
| | Density $\rho_0$ (Kg/m$^3$) | 2200 | +1.5 | $0 \text{ to } 10 \times 10^{-3}$ |

Table 2 shows the Young's modulus and density of the silicon and silicon oxide film and the temperature coefficient thereof. FIGS. 11 and 12 are characteristic diagrams showing the temperature coefficients of frequency of the electrostatic vibrator shown in FIG. 7 calculated using the numerical values shown in Table 2 and Equation (2).

FIG. 11 is a characteristic diagram showing the dependency of the first-order frequency temperature coefficient α on the silicon oxide film thickness ratio Γ (=b/a). The vertical axis represents the first-order frequency temperature coefficient α and the horizontal axis represents the silicon oxide film thickness ratio Γ. Characteristic curves 1101 shown in this figure show a plurality of characteristic curves showing the relationships between the first-order frequency temperature coefficient α and the silicon oxide film thickness ratio Γ with the aspect ratio a/h of the cross section of the vibrating part 804 shown in FIG. 9 used as a parameter. From this figure, it can be found that in any aspect ratio a/h, there is a silicon oxide film thickness ratio Γ at which the first-order frequency temperature coefficient α is 0. That is, regardless of the magnitude of the aspect ratio of the cross section of the vibrating part 804, there is an optimal silicon oxide film thickness ratio Γ at which the first-order frequency temperature coefficient α is 0.

FIG. 12 is a characteristic diagram showing the dependency of the second-order frequency temperature coefficient β on the silicon oxide film thickness ratio Γ (=b/a). The vertical axis of FIG. 12 represents the second-order frequency temperature coefficient β, and the horizontal axis represents the silicon oxide film thickness ratio Γ. Characteristic curves 1201 shown in this figure show a plurality of characteristic curves showing the relationships between the second-order frequency temperature coefficient β and the silicon oxide film thickness ratio Γ with the aspect ratio a/h of the cross section of the vibrating part 804 shown in FIG. 9 used as a parameter. From this figure, it can be found that, even when the aspect ratio a/h is changed, there will be no silicon oxide film thickness ratio Γ at which the second-order frequency temperature coefficient β is 0. That is, from this figure, it can be found that the second-order frequency temperature coefficient β cannot be made to be 0 by the effect of the silicon oxide film.

This is why the conventional silicon oxide film-attached electrostatic vibrator cannot realize the second-order frequency temperature coefficient β which has almost the same value as the second-order frequency temperature coefficient of the AT-cut despite the fact that it can realize the first-order frequency temperature coefficient α which has almost the same value as the first-order frequency temperature coefficient of the AT-cut. The present invention has been made in view of the above-described problems, and aims to provide an electrostatic vibrator of which both the first and second-order frequency temperature coefficients α and β are substantially zero simultaneously, namely, have almost the same values as those of the AT-cut.

SUMMARY OF THE INVENTION

The present invention has been made to solve the above problems. A vibrating part of an MEMS-type electrostatically actuated flexural vibrator having both-end fixed type vibration boundary conditions is characterized in that it has a structure in which a silicon oxide film is formed thereon, and a compressive stress generated when forming the silicon oxide film is applied to the vibrating part from both ends of the vibrating part.

A stress application mechanism of the compressive stress is configured as below. The stress application mechanism is characterized in that it has at least one beam at a position parallel to the vibrating part and has a structure in which both ends of the beam and both ends of the vibrating part are integrally formed, and at least one end of the vibrating part is connected onto a silicon substrate, whereby a thermoelastic deformation stress of the beam generated before or after forming the silicon oxide film is applied to the vibrating part as a compressive stress.

The present invention provides an electrostatic vibrator including: a vibrating plate having vibrating parts which are covered with a silicon oxide film, and which are beams with both ends fixed, and are electrostatically actuated so as to perform flexural vibration; a box layer which is connected to a part of the vibrating plate so as to fix the vibrating plate; a substrate which is connected to a surface facing the surface of the box layer connected to the vibrating plate in parallel to the vibrating plate; and electrodes which are formed on the substrate so as to be arranged in parallel with a void on both sides of each of the vibrating parts.

The vibrator of the present invention is characterized in that the Young's modulus of the electrostatic flexural vibrator has a negative temperature coefficient.

The vibrator of the present invention is characterized in that the silicon oxide film of the vibrator is formed in line symmetry with respect to any of a longitudinal direction and a lateral direction of the vibrating parts.

The vibrator of the present invention is characterized in that at least two of the vibrating parts are formed on the vibrating plate, and the entire vibrating parts are arranged in parallel.

The vibrator of the present invention is characterized in that the vibrating plate includes temperature compensation parts, which is not covered with a silicon oxide film, and the vibrating parts.

The vibrator of the present invention is characterized in that at least two of the temperature compensation parts are formed on the vibrating plate and arranged in line symmetry with respect to a central line of the substrate.

The vibrator of the present invention is characterized in that the vibrating parts are formed on both sides of each of the temperature compensation parts with a fixed part disposed therebetween.

The vibrator of the present invention is characterized in that the substrate has voids at positions corresponding to the temperature compensation parts.

The vibrator of the present invention is characterized in that the substrate has a pair of box layers along the opposing sides thereof, the fixed parts of the vibrating parts are connected to a pair of buffer layers, and a protruding part configured to be mountable by single-end fixing is formed on a part of a surface of the substrate opposite the vibrating plate.

The vibrator of the present invention is characterized in that the silicon oxide film is a film which is formed by a thermal oxidation method.

The vibrator of the present invention is characterized in that the silicon oxide film is a film which is formed by a CVD method.

The present invention also provides an electronic apparatus having the vibrator.

Both the first and second-order temperature coefficients of a compressive stress resulting from a thermoelastic deformation of parts other than the vibrating part generated before and after forming the silicon oxide film have a positive value. By employing a mechanism in which the compressive stress is applied to the vibrating part on which the silicon oxide film is formed, the first and second-order temperature coefficients can be made to be simultaneously zero. In this way, an electrostatic vibrator having frequency temperature characteristics of the same level as the AT-cut can be realized.

BRIEF DESCRIPTION OF THE DRAWINGS

FIG. 1 is a perspective view showing a structure of an electrostatic vibrator according to one embodiment of the present invention.

FIG. 2 is a transverse sectional view of a vibrating part 102 and a vibrating part 103 shown in FIG. 1.

FIG. 3 is a longitudinal sectional view of the vibrating part 102 and the vibrating part 103 shown in FIG. 1.

FIG. 4 is a diagram illustrating a compressive stress application mechanism according to a first embodiment of the present invention.

FIG. 5 is a conceptual diagram of an SOI wafer used for manufacturing an electrostatic vibrator.

FIG. 6 is a characteristic diagram showing frequency temperature characteristics of an AT-cut.

FIG. 7 is a characteristic diagram showing frequency temperature characteristics of a conventional electrostatic vibrator.

FIG. 8 is a perspective view of a single-end fixed type flexural vibration-mode electrostatic vibrator in which a silicon oxide film is formed on a vibrating part.

FIG. 9 is a sectional view of a vibrating part 804 shown in FIG. 8.

FIG. 10 is a characteristic diagram showing frequency temperature characteristics of the electrostatic vibrator shown in FIGS. 8 and 9.

FIG. 11 is a characteristic diagram showing the dependency of a first-order frequency temperature coefficient α on a silicon oxide film thickness ratio Γ (=b/a).

FIG. 12 is a characteristic diagram showing the dependency of a second-order frequency temperature coefficient β on a silicon oxide film thickness ratio Γ (=b/a).

FIG. 13 is a characteristic diagram illustrating a change in temperatures near the room temperature of a compressive stress of a vibrating part according to the present invention.

FIG. 14 is a characteristic diagram showing the dependency of a first-order frequency temperature coefficient α of an electrostatic vibrator according to the present invention on a vibrator side ratio L/a.

FIG. 15 is a characteristic diagram showing the dependency of a second-order frequency temperature coefficient β of the frequency temperature characteristic of the vibrator according to the present invention on a vibrator side ratio L/a.

FIG. 16 is a characteristic diagram showing the functional relationship between a vibrator side ratio R and a silicon oxide film thickness ratio Γ at which the second-order frequency temperature coefficient β according to the present invention becomes zero.

FIG. 17 is a characteristic diagram illustrating the effects of the electrostatic vibrator according to the present invention.

FIG. 18 is a perspective view showing a structure of an electrostatic vibrator according to a second embodiment of the present invention.

FIG. 19 is a diagram illustrating a compressive stress application mechanism according to the second embodiment of the present invention.

FIG. 20 is a perspective view showing a structure of an electrostatic vibrator according to a third embodiment of the present invention.

FIG. 21 is a diagram showing a sectional structure of the electrostatic vibrator according to the third embodiment of the present invention.

DETAILED DESCRIPTION OF THE PREFERRED EMODIMENTS

Hereinafter, the embodiments of the present invention and the effects thereof will be described with reference to the drawings. FIG. 1 is a perspective view showing a structure of an electrostatic vibrator according to one embodiment of the present invention. A vibrator having a length of L is formed on a silicon substrate (substrate) 101. The vibrator is configured by two vibrating parts (first parts) formed with the same shape and which are first beams having the same dimensions and with both ends fixed (both-end fixed type vibration boundary conditions). The vibrator having the two vibrating parts which are vibrating parts 102 and 103, respectively, is formed to be integral with fixed parts (second parts) 104 and 105. Moreover, a pair of temperature compensation parts 106 is formed as second beams at positions parallel to the vibrating parts 102 and 103. Furthermore, these temperature compensation parts 106 and vibrating parts 102 and 103 are integrally formed with the fixed parts 104 and 105 disposed therebetween. The fixed part 104 is fixed onto the silicon substrate 101 with a box layer (oxide layer) 107 disposed therebetween. In contrast, a void 108 corresponding to the thickness of the box layer 107 is present between the fixed part 105 and the silicon substrate 101. The vibration displacements of the vibrating parts 102 and 103 are a vibration displacement 109 and a vibration displacement 110, respectively, of which the vibration amplitudes are the same and a difference of the phases thereof is 180?. The vibrating parts 102 and 103 and the fixed parts 104 and 105 are formed on the same plane, and a plane including these parts is referred to as a vibrating plate 118.

Excitation electrodes 111 and 112 shown in the figure are excitation electrodes for exciting such a vibration displacement. Both excitation electrodes are formed to be integral with the silicon substrate 101 with the box layer 107 disposed therebetween. A pair of excitation electrodes 111 disposed at the outer side of the vibrating parts 102 and 103 and the excitation electrode 112 disposed at the inner side of both vibrating parts are electrically connected so as to have different polarities. Moreover, the hatched part in the figure is a silicon oxide film 113 which is formed in only the vicinities including the vibrating parts 102 and 103. The silicon oxide film 113 is a silicon oxide film that is formed in accordance with a thermal oxidation method. In general, in a thermal oxidation process, a silicon oxide film is formed on the temperature compensation parts 106 as well as the vibrating parts 102 and 103. However, in the electrostatic vibrator shown in the figure, after the thermal oxidation, the silicon oxide film formed on the temperature compensation parts 106 is selectively removed using ion milling processing or the like.

In the thermal oxidation, the silicon oxide film is formed on the surfaces of the silicon substrate 101 and the excitation electrodes 111 and 112 other than the vibrating parts and temperature compensation parts according to the present invention. However, since the silicon oxide film does not have a great influence on the frequency temperature characteristics which should be improved by the present invention, illustration thereof is omitted in the description of the figure.

FIG. 2 is a transverse sectional view of the vibrating parts 102 and 103 shown in FIG. 1. The sectional structure of the vibrating parts 102 and 103 has a two-layered structure including the silicon oxide film 113 surrounding the cross section and a silicon part 114 at the central part. In FIG. 2, as shown in the figure, the width and thickness dimensions of the vibrating part and the thickness dimension of the silicon oxide film are a, h, and b similarly to FIG. 9.

FIG. 3 is a longitudinal sectional view of the vibrating parts 102 and 103 shown in FIG. 1 and a sectional view near a central point 116 of both vibrating parts. In the sectional view, similarly to FIG. 2, the sectional structure has a two-layered structure including the silicon oxide film 113 surrounding the cross section and the silicon part 114 at the central part. In the vibrating parts of the electrostatic vibrator shown in FIG. 1 according to the present invention, a stress is applied in parallel to an axial line 115 in the longitudinal direction of the vibrating parts and to the silicon oxide film 113 having a thickness of b formed around the silicon part 114. The application direction and magnitude of the stress exhibit uniform distribution in the direction of the axial line 115. In contrast, the stress distribution within the transverse section shown in FIG. 3 is not uniform in the thickness and width directions as well as in the regions of the silicon oxide film 113 and the silicon part 114. Although detailed theoretical description is omitted, it was found that a stress distributed in the vibrating parts of the electrostatic vibrator has an influence on the frequency characteristics and the frequency temperature characteristics as an average stress within the transverse section of the vibrating parts. The average stress within the transverse section of the vibrating parts is an average sectional stress 117 shown in the figure. The average sectional stress 117 is a stress acting in the direction of the central point 116, namely a compressive stress, and has a negative (−) sign.

The resonance frequency of the electrostatic vibrator shown in FIGS. 1, 2, and 3 in which the silicon oxide film is formed on the vibrating parts and to which a stress is applied is given by Equation (7).

[Equation 7]

$$F = \frac{n^2}{4\pi}\sqrt{\frac{E_S}{3\rho_S}}\frac{a}{L^2}(1+2\Gamma)\phi(\Gamma)\left[1 + \frac{12}{n^2}\frac{\rho_S \sigma_0}{\langle\rho\rangle E_S}\left(\frac{L}{a}\right)^2 (1+2\Gamma)^{-2}\phi(\Gamma)^{-2}\right]^{\frac{1}{2}} \quad (7)$$

Here, $E_s$ and $\rho_s$ are the Young's modulus and density of silicon, respectively, and a and L are the width and length dimensions of the vibrator shown in FIGS. 1, 2, and 3. The silicon oxide film thickness ratio $\Gamma$, oxide film correction function $\phi(\Gamma)$, $\Delta_E$, and $\Delta_\rho$ are defined by the same definitional equations as Equations (3) to (6). In addition, the average sectional stress 117 shown in FIG. 3 is $\sigma_0$ in Equation (7). Moreover, $\langle\rho\rangle$ is the density of the electrostatic vibrator shown in the figure and is given by Equation (8) by using the density $\rho_s$ of silicon, the density $\rho_0$ of the silicon oxide film, the width dimension a and the thickness dimension h of the vibrating part, and the thickness dimension b of the silicon oxide film.

[Equation 8]

$$\langle\rho\rangle = \rho_S \frac{1 + \frac{2\Gamma}{1+2\Gamma}\Delta_\rho + 2\frac{b}{h}(1+\Delta_\rho)}{1 + 2\frac{b}{h}} \quad (8)$$

In addition, in the electrostatic vibrator shown in the figure having the both-end fixed type vibration boundary conditions, a wave number n in Equation (7) is determined by Equation (9).

[Equation 9]

$$n = 4.730\left[1 - \frac{6 \times 0.2250}{(4.730)^2}\left(\frac{L}{a}\right)^2 \frac{\rho_S}{\langle\rho\rangle}(1+2\Gamma)^{-2}\phi(\Gamma)^{-2}\frac{\sigma_0}{E_S}\right] \quad (9)$$

As shown in Equations (7), (8), and (9), it was found that, when a sectional stress are simultaneously applied to the vibrating parts and the silicon oxide film, the temperature coefficient of frequency thereof depends on the average sectional stress $\sigma_o$ and the vibrating part side ratio L/a as well as the silicon oxide film thickness ratio $\Gamma$ (=b/a). In other words, it was found that the temperature coefficient of frequency depends on the temperature characteristics of the average sectional stress applied to the vibrating parts as well as a change in the temperature characteristics of the second moment of area.

FIG. 4 is a diagram illustrating a mechanism in which a thermoelastic deformation is applied to the vibrating parts as a compressive stress in the electrostatic vibrator shown in FIGS. 1, 2, and 3 according to the present invention. This figure is a top view of an electrostatic vibrator according to the present invention shown in FIG. 1, which includes the vibrating parts 102 and 103 on which the silicon oxide film 113 is formed, and the pair of temperature compensation parts 106 formed to be integral with the vibrating parts at positions parallel to the vibrating parts with the fixed parts 104 and 105 disposed therebetween.

In the figure, a compensation part thermoelastic deformation stress 401 is present in the temperature compensation parts 106. Moreover, a vibrating part thermoelastic stress 402 is present in the vibrating parts 102 and 103. In the thermal oxidation process for forming the silicon oxide film of the electrostatic vibrator according to the present invention, the silicon oxide film is formed on the beam 106 as well as the vibrating parts 102 and 103. However, after the thermal oxidation, the silicon oxide film formed on the temperature compensation parts 106 are selectively removed by ion milling processing or the like.

The magnitudes of the compensation part thermoelastic deformation stress 401 and the vibrating part thermoelastic stress 402 shown in FIG. 4 are different.

TABLE 3

| | Linear Expansion Rate (ppm/° C.) |
|---|---|
| Silicon | 2.84 |
| Silicon Oxide Film | 0.5 |

Table 3 shows the linear expansion rates of the silicon and the silicon oxide film, and the linear expansion rates of the silicon and the silicon oxide film differ greatly. The linear expansion rate of the silicon oxide film has a value which is equal to or smaller than ⅕ of that of the silicon. With the removal of the silicon oxide film, the temperature compensation parts 106 have a linear expansion rate that is equivalent to the linear expansion rate of the silicon.

In contrast, the linear expansion rate of the vibrating parts 102 and 103 on which the silicon oxide film 113 is formed changes greatly due to the influence of the silicon oxide film 113. The linear expansion rate has a small value as compared with the linear expansion rate of the conventional silicon.

The compensation part thermoelastic stress 401 shown in the figure is proportional to the linear expansion rate of the temperature compensation parts 106. The vibrating part thermoelastic stress 401 is proportional to the linear expansion rate of the vibrating parts 102 and 103. Therefore, the vibrating part thermoelastic stress 401 shown in the figure is larger than the compensation part thermoelastic stress 402 shown in the same figure. A difference in the magnitudes of both thermoelastic stresses is the cause of the average sectional stress 117 which acts on the vibrating parts shown in FIG. 3 as a compressive stress.

FIG. 13 shows the average sectional stress in the vibrating parts generated due to the difference in the magnitudes of the thermoelastic stresses of the vibrating part thermoelastic stress 401 and the compensation part thermoelastic stress 402. That is, FIG. 13 is a characteristic diagram illustrating a change in temperatures near the room temperature of the compressive stress.

The silicon oxide film is thermally oxidated in an atmosphere including water vapor. The calcination temperature is about 1000° C. The vertical axis of the figure represents the average sectional stress (compressive stress) of the vibrating parts 102 and 103, and the horizontal axis represents temperature. Moreover, the region corresponding to the vertical axis of the figure is a region where the average sectional stress has a negative value, and the average sectional stress approaches zero as it goes upward along the vertical axis. Three characteristic curves 1301, 1302, and 1303 in the figure are characteristic curves showing the temperature characteristics of the average sectional stress according to the present invention. These curves become different characteristic curves depending on the silicon oxide film thickness ratio $\Gamma$ defined by Equation (3).

As the ratio $\Gamma$ increases, the average sectional stress shown in the figure increases toward the negative side and acts as a larger compressive stress. That is, if the silicon oxide film thickness ratios corresponding to the characteristic curves 1301, 1302, and 1303 are $\Gamma_1$, $\Gamma_2$, and $\Gamma_3$, respectively, they satisfy a relation of $\Gamma_1 > \Gamma_2 > \Gamma_3$. The important characteristics of the temperature change of the average sectional stress shown in the figure lie in that both the first and second-order temperature coefficients have a positive value.

Here, there are characteristics in that the average sectional stress acts as the compressive stress and that both the first and second-order temperature coefficients have a positive sign. These characteristics can be explained by the fact that both ends of the temperature compensation parts 106 and both ends of the vibrating parts 102 and 103 shown in FIGS. 1, 2, and 3 are connected to each other. Furthermore, in general, the silicon oxide film is formed on the vibrating parts. In addition to this, the temperature compensation parts on which the silicon oxide film is not formed are connected to both ends of the vibrating parts, whereby the average sectional stress induced in the cross sections of the vibrating parts acts as a compressive stress. Furthermore, both the first and second-order temperature coefficients of the compressive stress have a positive sign.

Both the first and second-order temperature coefficients of the average sectional stress acting on the vibrating parts as the compressive stress have a positive value. Therefore, by controlling the silicon oxide film thickness ratio $\Gamma$ (=b/a) and the vibrating part side ratio L/a, the second-order temperature coefficient as well as the first-order temperature coefficient can be controlled.

FIG. 14 is a characteristic diagram showing the dependency of the first-order frequency temperature coefficients $\alpha$ of the vibrator shown in FIG. 1 on the vibrator side ratio L/a. The characteristic curve is shown with the silicon oxide film thickness ratio $\Gamma$ (=b/a) used as a parameter. The vertical axis represents the first-order frequency temperature coefficient $\alpha$ and the horizontal axis represents the vibrator side ratio L/a.

The silicon oxide film thickness ratios $\Gamma$ corresponding to four characteristic curves 1401, 1402, 1403, and 1404 are $\Gamma_1$, $\Gamma_2$, $\Gamma_3$ and $\Gamma_4$, respectively, and they satisfy a relation of $\Gamma_1 < \Gamma_2 < \Gamma_3 < \Gamma_4$. With the increase of the silicon oxide film thickness ratio $\Gamma$, the vibrator side ratio R at which the first-order frequency temperature coefficient $\alpha$ becomes zero changes. That is, in the figure, the vibrator side ratios are $R_{1\alpha}$, $R_{2\alpha}$, $R_{3\alpha}$, and $R_{4\alpha}$ for the silicon oxide film thickness ratios $\Gamma_1$, $\Gamma_2$, $\Gamma_3$, and $\Gamma_4$, respectively. It can be found that the vibrator side ratio at which the first-order frequency temperature coefficient $\alpha$ is zero has a functional relationship such that it decreases with the increase of the silicon oxide film thickness ratio $\Gamma$.

FIG. 15 is a characteristic diagram showing the dependency of the second-order frequency temperature coefficient $\beta$ of the frequency temperature characteristics of the vibrator according to the present invention shown in FIG. 1 on the vibrator side ratio L/a. This figure shows the dependency with the silicon oxide film thickness ratio $\Gamma$ (=b/a) used as a parameter. The vertical axis represents the second-order frequency temperature coefficient $\beta$ and the horizontal axis represents the vibrator side ratio L/a. The silicon oxide film thickness ratios $\Gamma$ corresponding to four characteristic curves 1501, 1502, 1503, and 1504 have values $\Gamma_1$, $\Gamma_2$, $\Gamma_3$, and $\Gamma_4$, respectively, similarly to FIG. 14, and they satisfy a relation of $\Gamma_1 < \Gamma_2 < \Gamma_3 < \Gamma_4$ similarly to FIG. 14.

From the figure, it can be found that there is a vibrator side ratio at which the second-order frequency temperature coefficient $\beta$ becomes zero.

The reason for this results from the fact that as described in FIG. 13, the second-order temperature coefficient of the compressive stress acting on the vibrator according to the present invention has a positive value. Similarly to FIG. 14, with the increase of the silicon oxide film thickness ratio $\Gamma$, the vibrator side ratio R at which the second-order frequency temperature coefficient $\beta$ becomes zero changes. That is, in the figure, the vibrator side ratios R are $R_{1\beta}$, $R_{2\beta}$, $R_{3\beta}$, and $R_{4\beta}$ for the silicon oxide film thickness ratios $\Gamma_1$, $\Gamma_2$, $\Gamma_3$, and $\Gamma_4$, respectively. It can be found that the vibrator side ratio at which the second-order frequency temperature coefficient $\beta$ is zero has a functional relationship such that it decreases with the increase of the silicon oxide film thickness ratio $\Gamma$.

FIG. 16 is a characteristic diagram showing the functional relationship, described in FIG. 14, between the vibrator side ratio and the silicon oxide film thickness ratio $\Gamma$ at which the first-order frequency temperature coefficient $\alpha$ becomes zero, as a characteristic curve 1601, and the functional relationship, described in FIG. 15, between the vibrator side ratio R and the silicon oxide film thickness ratio $\Gamma$ at which the second-order frequency temperature coefficient $\beta$ becomes zero, as a characteristic curve 1602.

In the figure, the vertical axis represents the vibrator side ratio R (=L/a), and the horizontal axis represents the silicon oxide film thickness ratio $\Gamma$ (=b/a). The intersection 1603 of the two characteristic curves 1601 and 1602 is the point at which both the first and second-order frequency temperature coefficients $\alpha$ and $\beta$ become zero simultaneously. At that time, the silicon oxide film thickness ratio and the vibrator side ratio are $\Gamma_0$ and $R_0$, respectively. FIG. 17 is a characteristic diagram showing the frequency temperature characteristics of the electrostatic vibrator according to the present invention shown in FIG. 1, to which the two design parameters are applied.

FIG. 17 is a characteristic diagram illustrating the effects of the electrostatic vibrator according to the present invention. The vertical axis represents the rate of frequency change and the horizontal axis represents temperature. A characteristic curve 1701 in the figure shows the frequency temperature characteristics according to the present invention, and a characteristic curve 601 shows the frequency temperature characteristics of the AT-cut described in FIGS. 6 and 10. As can be understood from the figure, in the electrostatic vibrator according to the present invention, the silicon oxide film of which the first-order temperature coefficient of the Young's modulus has a positive value is formed on the vibrating parts, and a compressive stress which is generated when forming the silicon oxide film and of which both the first and second-order temperature coefficients have a positive value is applied. Therefore, the poor frequency-temperature characteristics resulting from the fact that the first and second-order temperature coefficients of the Young's modulus of the silicon having negative values can be improved so that the first and second-order frequency temperature coefficients $\alpha$ and $\beta$ become zero simultaneously. In this way, it is possible to realize the frequency-temperature characteristics of substantially the same level as the quartz AT-cut.

FIG. 18 is a perspective view showing a structure of an electrostatic vibrator according to a second embodiment of the present invention. A vibrator which has a length of L and which is configured by two vibrating parts which are first beams having the same shape and dimensions having both-end fixed type vibration boundary conditions is formed on a silicon substrate 1801. The two vibrating parts are vibrating parts 1802 and 1803, respectively.

In the vibrator, fixed parts 1804 and 1805 are integrally formed. A temperature compensation part 1806 is formed at an intermediate position of the vibrating parts 1802 and 1803 as a second beam. Moreover, these temperature compensation part 1806 and vibrating parts 1802 and 1803 are integrally formed with the fixed parts 1804 and 1805 disposed therebetween. The fixed part 1804 is fixed onto a silicon substrate 1801 with a box layer 1807 disposed therebetween. In contrast, a void 1808 corresponding to the thickness of the box layer 1807 is present between the fixed part 1805 and the silicon substrate 1801. The vibrating parts 1802 and 1803 and the fixed parts 1804 and 1805 are formed on the same plane, and a plane including these parts is referred to as a vibrating plate 1818.

The vibration displacements of the vibrating parts 1802 and 1803 are a vibration displacement 1809 and a vibration displacement 1810, respectively. The vibration amplitudes thereof are the same and a difference of the phases thereof is 180°. Excitation electrodes 1811, 1812, 1813, and 1814 shown in the figure are excitation electrodes for exciting such a vibration displacement. These excitation electrodes are formed to be integral with the silicon substrate 1801 with the box layer 1807 disposed therebetween. The excitation electrodes 1811 and 1813 have the same polarity, and the excitation electrodes 1812 and 1814 have a polarity opposite to that of the excitation electrodes 1811 and 1813.

Moreover, the hatched part in the figure is a silicon oxide film 1815 which is formed in only the vicinities including the vibrating parts 1802 and 1803. The silicon oxide film 1813 is a silicon oxide film that is formed in accordance with a thermal oxidation method. In general, in a thermal oxidation process, a silicon oxide film is formed on the temperature compensation part 1806 as well as the vibrating parts 1802 and 1803. However, in the electrostatic vibrator shown in the figure, after the thermal oxidation, the silicon oxide film formed on the temperature compensation part 1806 is selectively removed using ion milling processing or the like.

A void part 1816 formed in the silicon substrate 1801 is a void which is used when removing the oxide film formed on the temperature compensation part 1806. This is a void which is necessary when removing the oxide film on the rear surface of the temperature compensation part 1806 by ion milling processing or the like. In the thermal oxidation, the silicon oxide film is formed on the surfaces of the silicon substrate 1801 and the excitation electrodes 1811, 1812, 1813, and 1814 other than the vibrating parts and temperature compensation part according to the present invention. However, since the silicon oxide film does not have a great influence on the frequency temperature characteristics which should be improved by the present invention, illustration thereof is omitted in the description of the figure.

FIG. 19 is a diagram illustrating a mechanism in which a thermoelastic deformation is applied to the vibrating parts as a compressive stress in the electrostatic vibrator shown in FIG. 18 according to the present invention.

This figure is a top view of an electrostatic vibrator according to the present invention shown in FIG. 18, which includes the vibrating parts 1802 and 1803 on which the silicon oxide film 1815 is formed, and the temperature compensation part 1806 formed to be integral with the vibrating parts at an intermediate position of both vibrating parts with the fixed part 1804 and the fixed part 1805 disposed therebetween.

In the figure, a compensation part thermoelastic deformation stress 1901 is present in the temperature compensation part 1806. Moreover, a vibrating part thermoelastic stress 1902 is present in the vibrating parts 1802 and 1803. In the thermal oxidation process for forming the silicon oxide film of the electrostatic vibrator according to the present invention, the silicon oxide film is formed on the beam 1806 as well as the vibrating parts 1802 and 1803. However, after the thermal oxidation, the silicon oxide film formed on the temperature compensation parts 1806 are selectively removed by ion milling processing or the like. In the structure shown in FIG. 19, exactly the same action as the action shown in FIG. 4 describing the first embodiment according to the present invention can be obtained. In this way, the vibrating part thermoelastic deformation stress 1902 of the vibrating parts 1802 and 1803 acts as the compressive stress, and the same effects as the embodiment shown in FIG. 1 can be obtained.

FIG. 20 is a perspective view showing a structure of an electrostatic vibrator according to a third embodiment of the present invention.

A vibrator which has a length of L and which is configured by two vibrating parts which are first beams having the same shape and dimensions having both-end fixed type vibration boundary conditions is formed on a silicon substrate 2001. The two vibrating parts are vibrating parts 2002 and 2003, respectively. In the vibrator, fixed parts 2004 and 2005 are integrally formed. The fixed parts 2004 and 2005 are fixed onto the silicon substrate 2001 with a box layer 2006 disposed therebetween. The vibration displacements of the vibrating parts 2002 and 2003 are a vibration displacement 2007 and a vibration displacement 2008, respectively. The vibration amplitudes thereof are the same and a difference of the phases thereof is 180°. The vibrating parts 2002 and 2003 and the fixed parts 2004 and 2005 are formed on the same plane, and a plane including these parts is referred to as a vibrating plate 2018.

Excitation electrodes 2009 and 2010 shown in the figure are excitation electrodes for exciting such a vibration displacement. Both excitation electrodes are formed to be integral with the silicon substrate 2001 with the box layer 2006 disposed therebetween. Therefore, the vibrating parts 2002 and 2003 are in a state of being floated from the silicon substrate 2001 by a distance corresponding to the thickness of the box layer 2006.

A pair of excitation electrodes 2009 disposed at the outer side of the vibrating parts 2002 and 2003 and the excitation electrode 2010 disposed at the inner side of both vibrating parts are electrically connected so as to have different polarities. Moreover, the hatched part in the figure is a silicon oxide film 2011 which is formed in only the vicinities including the vibrating parts 2002 and 2003. The silicon oxide film 2011 is a silicon oxide film that is formed in accordance with a thermal oxidation method. A protruding part 2012 is formed on the rear surface of the silicon substrate 2001. The protruding part 2012 serves as a mounting part for an accommodation apparatus.

FIG. 21 is a diagram showing a sectional structure of the electrostatic vibrator according to the third embodiment shown in FIG. 20 and is a transverse sectional view of the vibrating part 2002 shown in FIG. 20.

In FIG. 21, a thermoelastic deformation stress 2101 is present in the silicon substrate 2001. Since both ends of the vibrating part 2002 is formed to be integral with the silicon substrate 2001 with the box layer 2006 disposed therebetween, the thermoelastic deformation stress 2101 present in the silicon substrate 2001 is applied to the vibrating part 2002 as a vibrating part thermoelastic stress 2102.

At this time, the silicon oxide film 2011 is formed on the vibrating part 2002, and due to the effect thereof, the linear expansion rate of the vibrating part 2002 is small as compared with the linear expansion rate of the silicon substrate 2001. Therefore, the vibrating part thermoelastic stress 2102 applied to the vibrating part 2002 will be a compressive stress. This stress application mechanism has the same principle as the stress application mechanism described earlier in FIGS. 1 and 18. This is a stress application mechanism which uses the thermoelastic stress present in the silicon substrate instead of the temperature compensation parts shown in FIGS. 1 and 18.

When the electrostatic vibrator shown in FIG. 21 is actually mounted on an accommodation apparatus, the bottom surface of the protruding part 2012 of the silicon substrate 2001 shown in FIG. 21 serves as a mounting part 2103. The reason for this will be described below.

When the bottom surface of the silicon substrate 2001 has a simple planar structure, the entirety of the bottom surface will be the mounting part, and there is fear in that the compressive stress applied to the vibrating part will change greatly due to the influence of the thermal expansion ratio of the accommodation apparatus. When the bottom part 2103 of the protruding part 2012 of the silicon substrate 2001 is used as the mounting part as shown in FIG. 21, the thermal expansion rate of the accommodation apparatus will have no influence on the vibrating part. In the thermal oxidation, the silicon oxide film is formed on the surfaces of the vibrating parts 2002 and 2003 and the excitation electrodes 2009 and 2010 according to the present invention. However, since the silicon oxide film has completely no influence on the frequency temperature characteristics which should be improved by the present invention, illustration thereof is omitted in the description of the FIG. 21. Furthermore, the silicon oxide film is formed on the surface part 2103 of the silicon substrate 2001. However, since the thickness thereof is sufficiently small as compared with the thickness of the silicon substrate 2001, the silicon oxide film will have no influence on the compressive stress. Therefore, illustration thereof is omitted in FIG. 21.

Although the embodiments of the present invention have been described in detail with reference to the drawings, the detailed configuration is not limited to the embodiments, and various changes can be made in design without departing from the spirit of the present invention. That is, a silicon oxide film is formed on the vibrating parts of an MEMS-type electrostatically-actuated flexural vibrator having both-end fixed type vibration boundary conditions. At least one structure where no oxide film is formed is provided near the vibrating parts. By employing a structure in which both ends of the structure and both ends of the vibrating parts are integrally formed, a compressive stress is applied to the vibrating parts. As a result, the frequency temperature characteristics can be improved.

The electrostatic vibrator according to the present invention has first-order frequency temperature coefficient α and second-order frequency temperature coefficient, both of which are substantially 0, and a compact and high-performance electronic apparatus can be created using the electrostatic vibrator.

FIGS. 11 to 16 and Equations 2 to 9 describing the effects of the present invention are drawings and equations described based on a shape such that a silicon oxide film is formed on the entire surface around the vibrating parts as shown in FIGS. 2 and 3. The silicon oxide film may be formed symmetrically with respect to any of the longitudinal direction and a lateral direction of the vibrating parts, namely symmetrically with respect to the central point of the vibrating parts. In this case, the second moment of area of the vibrating parts and the temperature characteristics thereof are changed. Therefore, although there are slight changes in some equations and the diagrams illustrating the effects, substantially the same results are obtained. That is, the characteristics of the present invention lie in the fact that the second moment of area of the vibrating parts is changed by forming a silicon oxide film having a temperature coefficient with a different sign from the temperature coefficient of the Young's modulus of silicon on the vibrating parts. In addition to this, the important characteristics of the present invention lie in the fact that the frequency-temperature characteristics of the vibrating parts can be improved by employing a structure that applies a compressive stress in the axial direction of the vibrating parts. Here, although the second moment of area can be changed even when the silicon oxide film is not disposed symmetrically with respect to the central point of the vibrating parts, due to the asymmetry of the silicon oxide film, a bending stress will act on the vibrating parts, and improvement of the frequency-temperature characteristics is not possible. Furthermore, the forming of the silicon oxide film is not limited to the thermal oxidation method, and exactly the same effects can be obtained when the silicon oxide film is formed in accordance with a CVD method.

The invention claimed is:

1. An electrostatic vibrator comprising:
a vibrating plate comprised of beam-shaped vibrating parts each fixed at opposite ends thereof and configured for electrostatic actuation to perform flexural vibration, and temperature compensation parts connected to the vibrating parts;
a silicon oxide film covering each of the vibrating parts but not the temperature compensation parts;
a substrate mounted in parallel relation to the vibrating plate,
an oxide layer disposed between the substrate and the vibrating plate; and
electrodes formed on the substrate and arranged on opposite sides of each of the vibrating parts.

2. The An electrostatic vibrator according to claim 1; wherein the electrostatic vibrator has a Young's modulus with a negative temperature coefficient.

3. An electrostatic vibrator according to claim 1; wherein the silicon oxide film is formed in line symmetry with respect to any of a longitudinal direction and a lateral direction of each vibrating part.

4. An electrostatic vibrator according to claim 1; wherein the vibrating parts comprise at least two of the vibrating parts arranged parallel to one another.

5. An electrostatic vibrator according to claim 1; wherein at temperature compensation parts comprise at least two of the temperature compensation parts connected to the vibrating parts and arranged in line symmetry with respect to a central line of the substrate.

6. An electrostatic vibrator according to claim 1; wherein the vibrating parts are formed on both sides of each of the temperature compensation parts with a fixed part disposed therebetween.

7. An electrostatic vibrator according to claim 6; wherein the substrate has voids at positions corresponding to the temperature compensation parts.

8. An electrostatic vibrator according to claim 1; wherein the silicon oxide film is formed by thermal oxidation.

9. An electrostatic vibrator according to claim 1; wherein the silicon oxide film comprises a chemical-vapor-deposited silicon oxide film.

10. An electronic apparatus having the electrostatic vibrator according to claim 1.

11. An electrostatic vibrator according to claim 1; wherein the oxide layer is disposed between the vibrating plate and the substrate.

12. An electrostatic vibrator according to claim 1; wherein each of the vibrating parts has a two-layer structure formed of a central silicon part surrounded by the silicon oxide film.

13. An electrostatic vibrator according to claim 1; wherein the vibrating plate further comprises two parts integrally mounted in parallel relation to one another on the substrate, the temperature compensation parts comprising two temperature compensation parts each connected to an end of each of the two parallel parts, and the vibrating parts comprising two vibrating parts fixed at the opposite ends thereof to respective portions of the parall parts between the ends of the parall parts.

14. An electrostatic vibrator according to claim 13; wherein the parallel parts of the vibrating plate are mounted on the substrate with the oxide layer disposed therebetween.

15. An electrostatic vibrator comprising:
a substrate;
an electrostatically-actuated flexural vibrating plate having first parts configured to undergo flexural vibration upon electrostatic actuation, second parts mounted on the substrate and formed integrally with the first parts, and temperature compensation parts integrally connected to the second parts;
a silicon oxide film covering at least the first parts of the vibrating plate, except for the temperature compensation parts; and
electrodes disposed on the substrate and arranged on opposite sides of the first parts of the vibrating plate.

16. An electrostatic vibrator according to claim 15; further comprising a buried oxide layer disposed between the vibrating plate and the substrate.

17. An electrostatic vibrator according to claim 15; wherein the temperature compensation parts comprise two temperature compensation parts each connected to an end of each of the second parts of the vibrating plate; and wherein the first parts of the vibrating plate extend between the second parts of the vibrating plate in parallel relation to the temperature compensation parts.

18. An electrostatic vibrator according to claim 15; wherein the silicon oxide film covers each of the second parts of the vibrating plate.

19. An electrostatic vibrator according to claim 15; wherein each of the first parts of the vibrating plate has a two-layer structure formed of a central silicon part surrounded by the silicon oxide film.

20. An electronic apparatus having the electrostatic vibrator according to claim 15.

\* \* \* \* \*